(12) United States Patent
Ichise et al.

(10) Patent No.: US 6,514,854 B2
(45) Date of Patent: Feb. 4, 2003

(54) METHOD OF PRODUCING SEMICONDUCTOR INTEGRATED CIRCUIT DEVICE HAVING A PLUG

(75) Inventors: Teruhisa Ichise, Ome (JP); Hiroyuki Uchiyama, Tachikawa (JP); Masayuki Suzuki, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/982,842

(22) Filed: Oct. 22, 2001

(65) Prior Publication Data

US 2002/0056916 A1 May 16, 2002

(30) Foreign Application Priority Data

Nov. 14, 2000 (JP) ........................................ 2000-347096

(51) Int. Cl.[7] .......................................... H01L 21/4763
(52) U.S. Cl. ........................ 438/629; 438/639; 438/672
(58) Field of Search ................................. 438/618–640, 438/672, 675

(56) References Cited

U.S. PATENT DOCUMENTS

| | | | |
|---|---|---|---|
| 5,604,365 A | | 2/1997 | Kajigaya et al. |
| 5,893,734 A | * | 4/1999 | Jeng et al. ................... 438/239 |
| 6,191,444 B1 | * | 2/2001 | Clampitt et al. ............ 257/288 |
| 6,287,914 B1 | * | 9/2001 | Uchiyama et al. .......... 433/243 |

FOREIGN PATENT DOCUMENTS

JP            7-122654            8/1994

* cited by examiner

*Primary Examiner*—Jey Tsai

(57) ABSTRACT

The bit lines composed of a conductive film containing the tungsten as a principal component are formed inside the side wall spacers formed on the side walls of the wiring grooves. The TiN film having a higher adhesive strength to the silicon oxide than the tungsten is formed on the boundary faces between the bit lines and the side wall spacers, which functions as an adhesive layer that prevents strippings on the boundary faces between the bit lines and the side wall spacers. Thereby, the invention prevents disconnections, even when the width of the wirings having the tungsten as the principal component is fined to 0.1 μm or less.

10 Claims, 31 Drawing Sheets

METHOD OF PRODUCING SEMICONDUCTOR INTEGRATED CIRCUIT DEVICE HAVING A PLUG

BACKGROUND OF THE INVENTION

The present invention relates to a semiconductor integrated circuit device and a method of producing the same, specifically to a technique effective in application to a DRAM (Dynamic Random Access Memory) in which the bit lines of minute line widths are formed with a conductive film containing W (tungsten) as the principal component.

The memory cells of a DRAM are arranged at the intersections of plural word lines and plural bit lines that are arrayed in a matrix on the principal plane of a semiconductor substrate. The memory cell is composed of one memory cell selecting MISFET (Metal Insulator Semiconductor Field Effect Transistor) and one data storing capacitor connected in series to the MISFET.

The memory cell selecting MISFET is mainly composed of a gate oxide film, a gate electrode integrated with a word line, and a pair of semiconductor areas that form the source and drain thereof. The data storing capacitor is laid out over the memory cell selecting MISFET, and is electrically connected to one of the source and drain of the memory cell selecting MISFET. Also, the bit line is laid out over the memory cell selecting MISFET, and is electrically connected to the other one of the source and drain.

The DRAM adopting the so-called stacked capacitor structure that arranges the data storing capacitors to overlie the memory cell selecting MISFETs adopts the Capacitor Over Bit-line (COB) structure that arranges the data storing capacitors to overlie the bit lines.

The bit lines of the DRAM having memory cells of the COB structure are formed on the same process as that of the first layer wirings of the peripheral circuits, and accordingly a low resistance metal containing the tungsten as the principal component is used as a bit line material. The DRAM in which the bit lines are formed with a metal film having the tungsten as the principal component is disclosed in, for example, the Japanese Published Unexamined Patent Application No. Hei 7(1995)-122654, and corresponding U.S. Pat. No. 5,604,365, etc.

SUMMARY OF THE INVENTION

The inventor has been concentrating the energies on further fining the COB structured DRAM that arranges the data storing capacitors over the bit lines.

In the COB structured memory cells, one of the sources and drains of the memory cell selecting MISFETs are connected with the data storing capacitors by way of through holes passing between the adjoining bit lines. Therefore, to reduce the memory cell size needs to reduce the pitch between the bit lines, and it becomes difficult to ensure the joint margin of the bit lines and the through holes passing between them. Accordingly, there occurs a problem that the plugs embedded inside the through holes can short-circuit the bit lines.

To avoid such deficiencies, it is necessary to make the bit lines as fine as possible, and the inventor has been investigating to introduce the so-called Damascene process as a measure for fining the bit lines, that embeds a conductive film serving as a bit-line material inside the wiring grooves formed on an insulating film.

In order to form the bit lines, this method first forms the wiring grooves by etching a silicon oxide film deposited on the memory cell selecting MISFETs. The wiring grooves are formed in the minimum size that is determined by the resolution limit of the photolithography. Next, the method deposits a second silicon oxide film having a thickness less than half the width of the wiring grooves, on the silicon oxide film including the insides of this wiring grooves, and forms side wall spacers composed of the second silicon oxide film on the side walls of the wiring grooves, by applying an anisotropic etching onto the second silicon oxide film. Since the width of the wiring grooves is equal to the minimum size that is determined by the resolution limit of the photolithography, the inside width of the side wall spacers becomes smaller than this minimum size. After depositing so thick a tungsten film as to completely bury the insides of the wiring grooves on the silicon oxide film including the insides of the wiring grooves, the method removes the tungsten film over the silicon oxide film by means of a chemical and mechanical polishing to leave the tungsten film only insides the wiring grooves.

Since the bit lines formed by the above method achieves the width narrower than the minimum size determined by the resolution limit of the photolithography, the joint margin of the adjoining bit lines and the through holes passing between them can be attained sufficiently, so that the memory cell size can be reduced.

Now, the bit lines BL formed by the above method produce local strippings on the boundary faces with the side wall spacers when the width of the bit lines is 1 $\mu$m or less. They further produce overall strippings on almost all over the areas of the wiring grooves when the width becomes narrower than 0.2 $\mu$m, which leads to disconnections as a result, which was found through the examinations by the inventor.

The present invention has been made in view of the above circumstances, and it is therefore an object of the invention to provide a technique that effectively prevents the disconnections when fining the width of the wirings composed of the tungsten as the principal component.

Another object of the invention is to provide a technique to reduce the memory cell size, by making the width of the bit lines as fine as less than the minimum processing size that is determined by the resolution limit of the photolithography.

Another object of the invention is to provide a technique that improves the detection sensitivity of signals stored in the data storing capacitors, by reducing parasitic capacitances along the bit lines of a DRAM.

The foregoing and other objects and the novel features of the invention will become apparent from the descriptions and accompanying drawings of this specification.

In the semiconductor integrated circuit device according to one aspect of the invention, wiring grooves are formed on a first insulating film formed on a principal plane of a semiconductor substrate, side wall spacers composed of a second insulating film are formed on the side walls of the wiring grooves, wirings containing the tungsten as a principal component are formed on the regions inside the side wall spacers, and an adhesive layer composed of a conductive film having a higher adhesive strength to the second insulating film than the tungsten is formed on the boundary faces between the side wall spacers inside the wiring grooves and the wirings.

Further, the method of producing the semiconductor integrated circuit device according to the invention includes the following processes:

(a) forming the wiring grooves on the first insulating film on the principal plane of the semiconductor substrate, depositing the second insulating film having such a film thickness that does not completely buries the insides of the wiring grooves on the first insulating film including the insides of the wiring grooves, and then forming the side wall spacers composed of the second insulating film on the side walls of the wiring grooves, by applying an anisotropic etching to the second insulating film, (b) depositing a second conductive film having such a film thickness that does not completely buries the insides of the wiring grooves, which has a higher adhesive strength to the second insulating film than the tungsten, on the first insulating film including the insides of the wiring grooves, then depositing a first conductive film containing the tungsten as the principal component on the second conductive film including the insides of the wiring grooves, and embedding the insides of the wiring grooves with the first conductive film, and (c) forming first wirings composed of the first conductive film inside the wiring grooves, by polishing the first conductive film and the second conductive film chemically and mechanically to remove the first conductive film and the second conductive film that lie outside the wiring grooves.

According to the foregoing means, the second conductive film having a higher adhesive strength to the second insulating film than the tungsten functions as the adhesive layer that prevents strippings on the boundary faces between the first wirings and the side wall spacers; and accordingly the disconnections of the first wirings can effectively prevented in case of the wirings being fined.

DETAILED DESCRIPTION OF THE PREFERRED EMBODIMENTS

The embodiment of the invention will be discussed in detail with reference to the accompanying drawings. Here, in all the drawings to explain the embodiment, the members having the same functions are given the same symbols to omit the repeated explanations.

Figure 1:
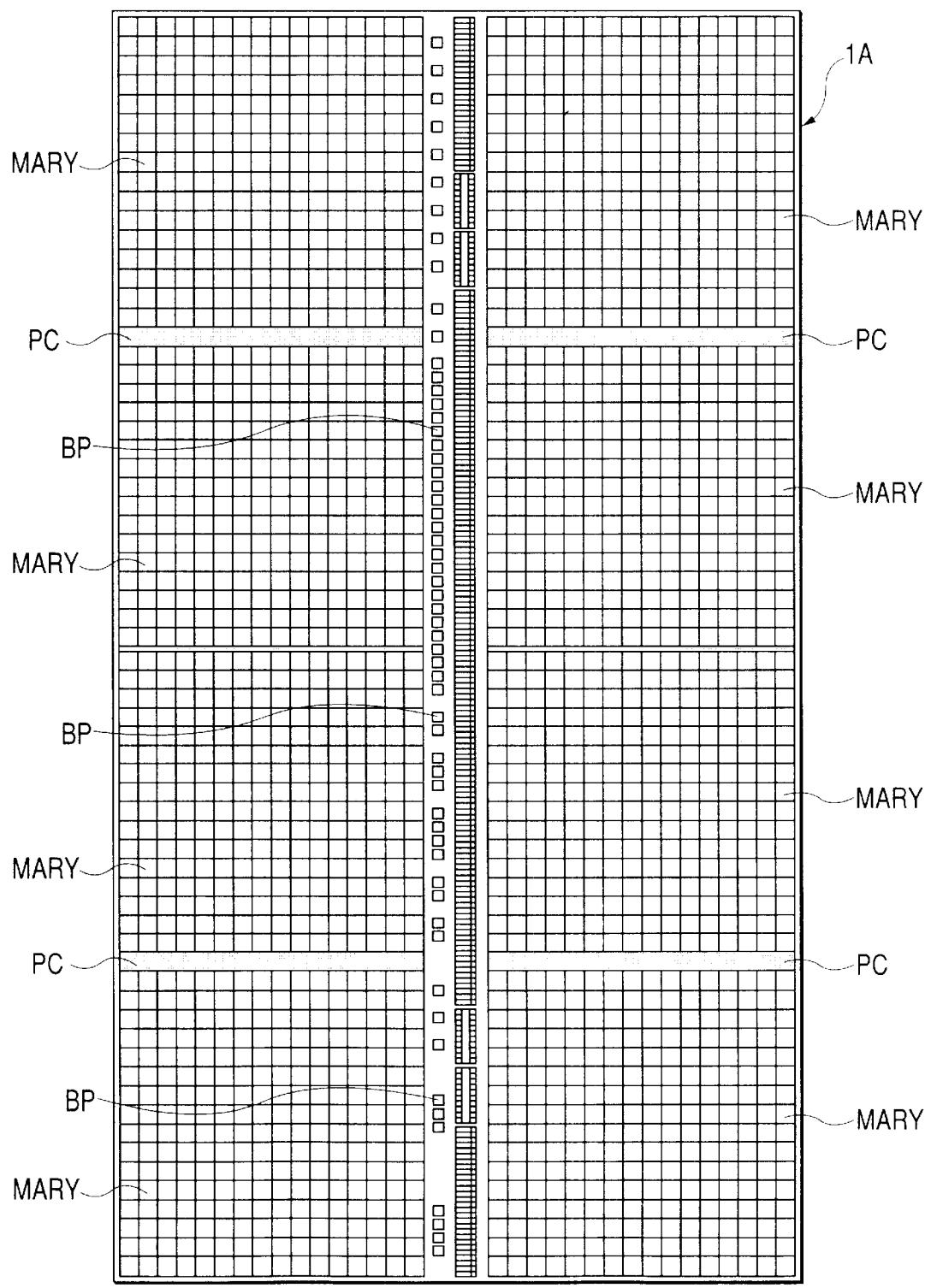
FIG. 1 is the overall plan view of a semiconductor chip on which a DRAM being one embodiment of the invention is formed.

FIG. 1 is the overall plan view of a semiconductor chip 1A having a DRAM of the embodiment formed thereon. On the principal plane of the rectangular semiconductor chip 1A is formed a DRAM having the memory capacity of, for example, 256 M bits. The DRAM includes storage areas of plural memory arrays (MARY) and peripheral circuit areas PC disposed around them as a principal component. On the center of the semiconductor chip 1A, plural bonding pads constituting the external connection terminal are arrayed in one line.

Figure 2:
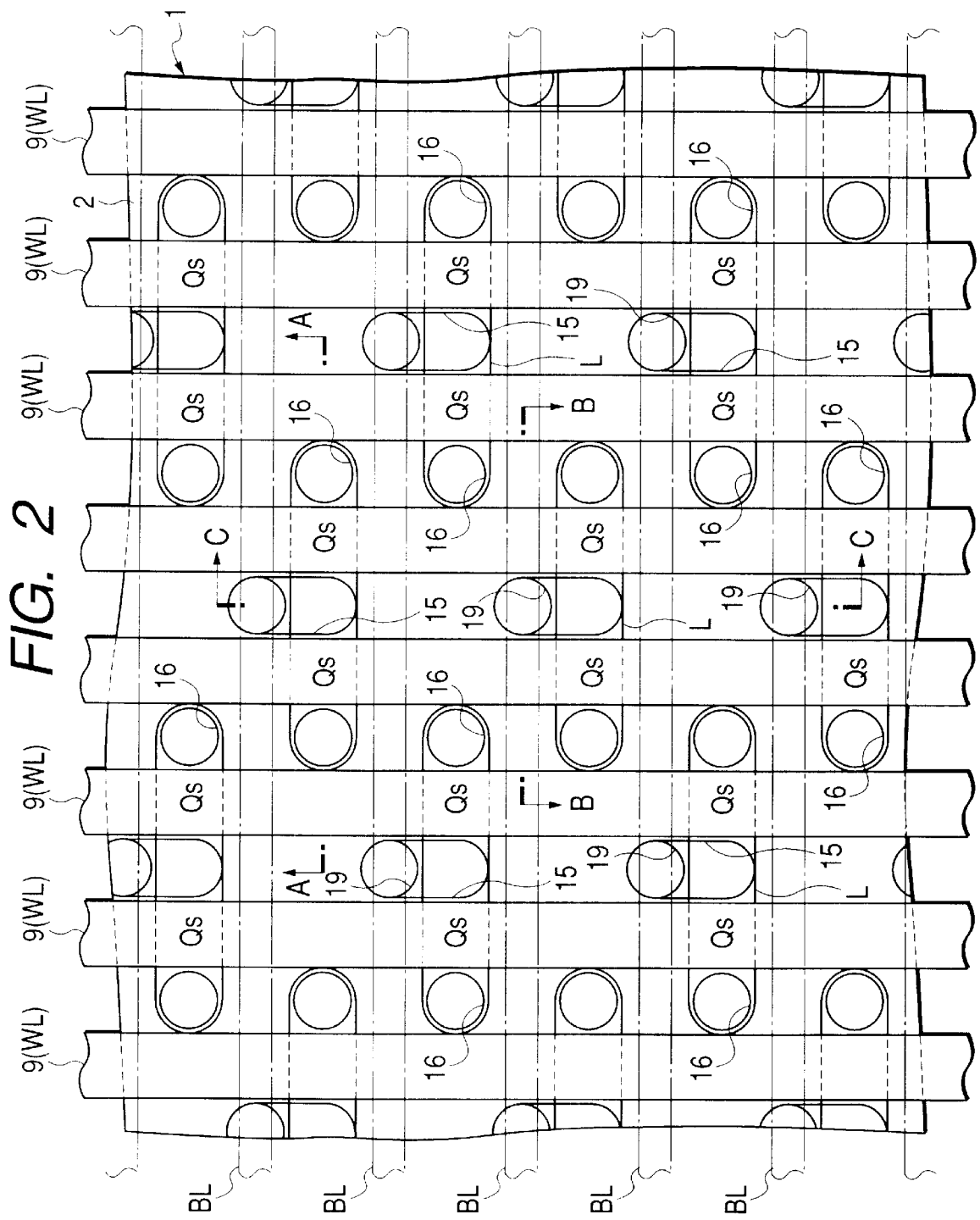
FIG. 2 is a plan view of a principal part of a semiconductor substrate, illustrating memory cells on the process of producing the DRAM being one embodiment of the invention.
Figure 3:
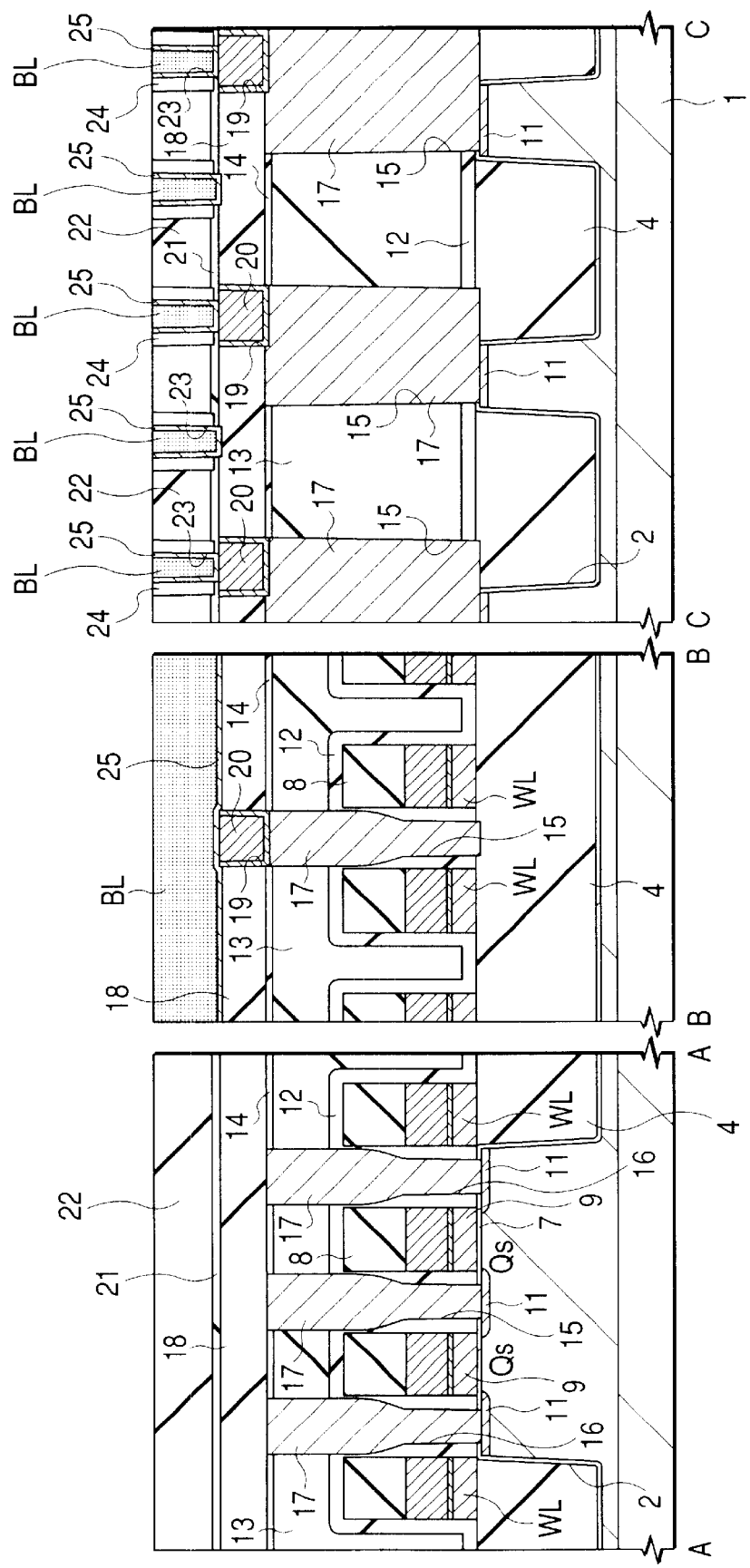
FIG. 3 is a sectional view of a principal part of the semiconductor substrate, illustrating the memory cells on the process of producing the DRAM being one embodiment of the invention.

FIG. 2 is a plan view of a principal part of a semiconductor substrate, illustrating a part of the memory arrays (MARY) on the way of the production process, and FIG. 3 is a sectional view of a principal part of the same. Here, the left part of FIG. 3 illustrates a section taken on by the A—A line in FIG. 2, the center part illustrates a section taken on by the B—B line, and the right part illustrates a section taken on by the C—C line.

As an example, a p-type well 3 is formed on the principal plane of a semiconductor substrate 1 made of a p-type single crystal silicon. Active regions L whose peripheries are stipulated by device isolation grooves 2 are formed on the p-type well 3. The device isolation grooves 2 have a silicon oxide film 4 embedded inside the grooves formed on the semiconductor substrate 1 (p-type well 3). The surface of the silicon oxide film 4 is flattened, and the height thereof is equal to the surface of the substrate 1 (p-type well 3) of the active regions L.

In each of the active regions L are formed two MISFETs (memory cell selecting MISFETs Qs) that share one of the source and the drain (n-type semiconductor regions 11). The memory cell selecting MISFET Qs is principally composed of a gate oxide film 7 formed on the surface of the substrate 1 (p-type well 3) of the active region L, a gate electrode 9 formed on the gate oxide film 7, and a pair of the n-type semiconductor regions 11, 11 (source, drain). The memory cell selecting MISFET Qs is connected in series to a data storing capacitor C (not illustrated in FIG. 2, FIG. 3) that is formed over the MISFET Qs on the following process, which constitute one bit memory cell.

The gate electrodes 9 of the memory cell selecting MISFETs Qs are formed integrally with word lines WL, which are extended lineally with a same width, with a same spacing along the vertical direction in FIG. 2. The width (gate length) and the spacing of the gate electrodes 9 (word lines WL) are each equal to the minimum dimensions that are determined by the resolution limit of the photolithography, and they are 0.15 μm, for example. The gate electrodes 9 (word line WL) are configured in a poly-metal structure, in which a WN (tungsten nitride) film and a W (tungsten) film are deposited on a low-resistance polycrystal silicon film with n-type impurities such as a phosphor (P) doped. A silicon nitride film 8 having the same plane pattern as the gate electrodes 9 (word lines WL) is formed over the gate electrodes 9 (word lines WL).

A silicon nitride film 12 and two-layered silicon oxide films 13, 14 are formed in this order from the lower layer over the memory cell selecting MISFETs Qs. Contact holes 15, 16 are formed through the silicon nitride film 12 and the silicon oxide films 13, 14 lying over the sources and drains (n-type semiconductor region 11) of the memory cell selecting MISFETs Qs. The contact holes 15, 16 have plugs 17 embedded inside thereof, which are made of, for example, a low-resistance polycrystal silicon film.

A silicon oxide film 18, a silicon nitride film 21, and a silicon oxide film (first insulating film) 22 are formed in this order from the lower layer over the silicon oxide film 14. The silicon oxide film 22 has plural wiring grooves 23 formed therein, which extend in the direction perpendicular to the direction of the gate electrodes 9 (word lines WL) extending, with a constant width and a constant spacing. The width of the wiring grooves 23 is equal to the minimum size, for example, 0.15 μm that is determined by the resolution limit of the photolithography. Further, the spacing between the adjoining wiring grooves 23, 23 is greater than the foregoing minimum size.

The wiring grooves 23 have side wall spacers 24 formed on the wall thereof, which are made of a silicon oxide film (second insulating film). Further inside the side wall spacers 24 are formed the bit lines BL made of a conductive film (first conductive film) with tungsten as the principal component. As mentioned above, since the with of the wiring grooves 23 is equal to the minimum size that is determined by the resolution limit of the photolithography, the inside width of the side wall spacers 24, namely the width of the bit lines BL is smaller than this minimum size (for example, 0.1 μm to 0.08 μm). As described later, the bit lines BL are formed by polishing chemically and mechanically the conductive film deposited on the silicon oxide film 22 including the insides of the wiring grooves 23; and, the height of the surface thereof is equal to that of the surface of the silicon oxide film 22.

On the boundary faces between the bit lines BL and the side wall spacers made of the silicon oxide film is formed a TiN film (second conductive film) 25 whose adhesive strength to the silicon oxide is greater than the tungsten. The TiN film 25 functions as the adhesive layer that prevents strippings on the boundary faces between the bit lines BL and the side wall spacers 24.

The TiN film 25 is formed inside the wiring grooves 23, together with the conductive film (conductive film having tungsten as the principal component) that forms the bit lines BL, accordingly the TiN film 25 itself functions as a part of the bit lines BL. Since TiN has about a single-digit greater resistance compared to W, the TiN film 25 is formed with a thin film (for example, about 7 nm) in order to reduce the resistance of the bit lines BL.

The bit lines BL are formed to linearly extend right and left in FIG. 2, along the perpendicular direction to the word lines WL, with a same width and a same spacing. The bit lines BL are connected electrically to one of the sources and the drains (n-type semiconductor regions 11) of the memory cell selecting MISFETs Qs (the n-type semiconductor region 11 shared by the two memory cell selecting MISFETs Qs), by way of plugs 20 inside through holes 19 formed on the silicon oxide film 18 underlying the bit lines BL, and by way of the plugs 17 inside the contact holes 15 further underlying the plugs 20.

Next, the method of producing a DRAM having such fine bit lines BL as above will be described according to the processes, with reference to FIG. 4 through FIG. 32.

Figure 4:
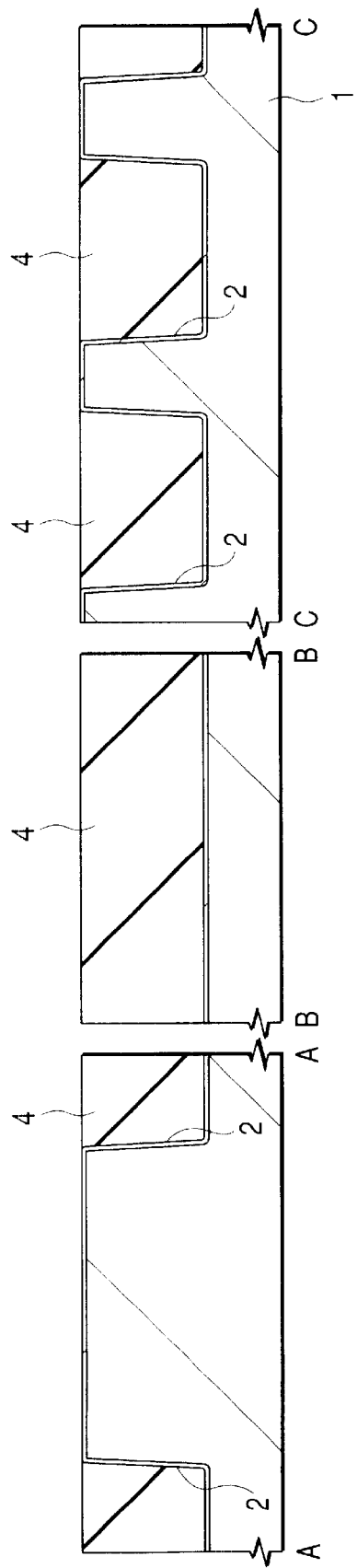
FIG. 4 is a sectional view of a principal part of the semiconductor substrate, illustrating the process of producing the DRAM being one embodiment of the invention.

As shown in FIG. 4, first the process is to form the device isolation grooves 2 on the semiconductor substrate 1 (hereunder, simply referred to as the substrate 1) made of the p-type single crystal silicon having the specific resistance of, for example, 1 to 10 Ωcm. In order to form the device isolation grooves 2, the process involves etching the device isolation region of the substrate 1 to form grooves having a depth of about 350 nm to 400 nm, then depositing the silicon oxide film 4 having a film thickness of about 500 nm to 600 nm on the substrate 1 including the insides of the grooves by the CVD method, and then carrying out the densification for improving the film quality of the silicon oxide film 4 by thermally oxidizing the substrate 1 under about 1000° C. Next, the process moves to removing the silicon oxide film 4 on the outsides of the grooves by polishing it chemically and mechanically, and leaving the silicon oxide film 4 having the surface flattened on the insides of the grooves.

Figure 5:
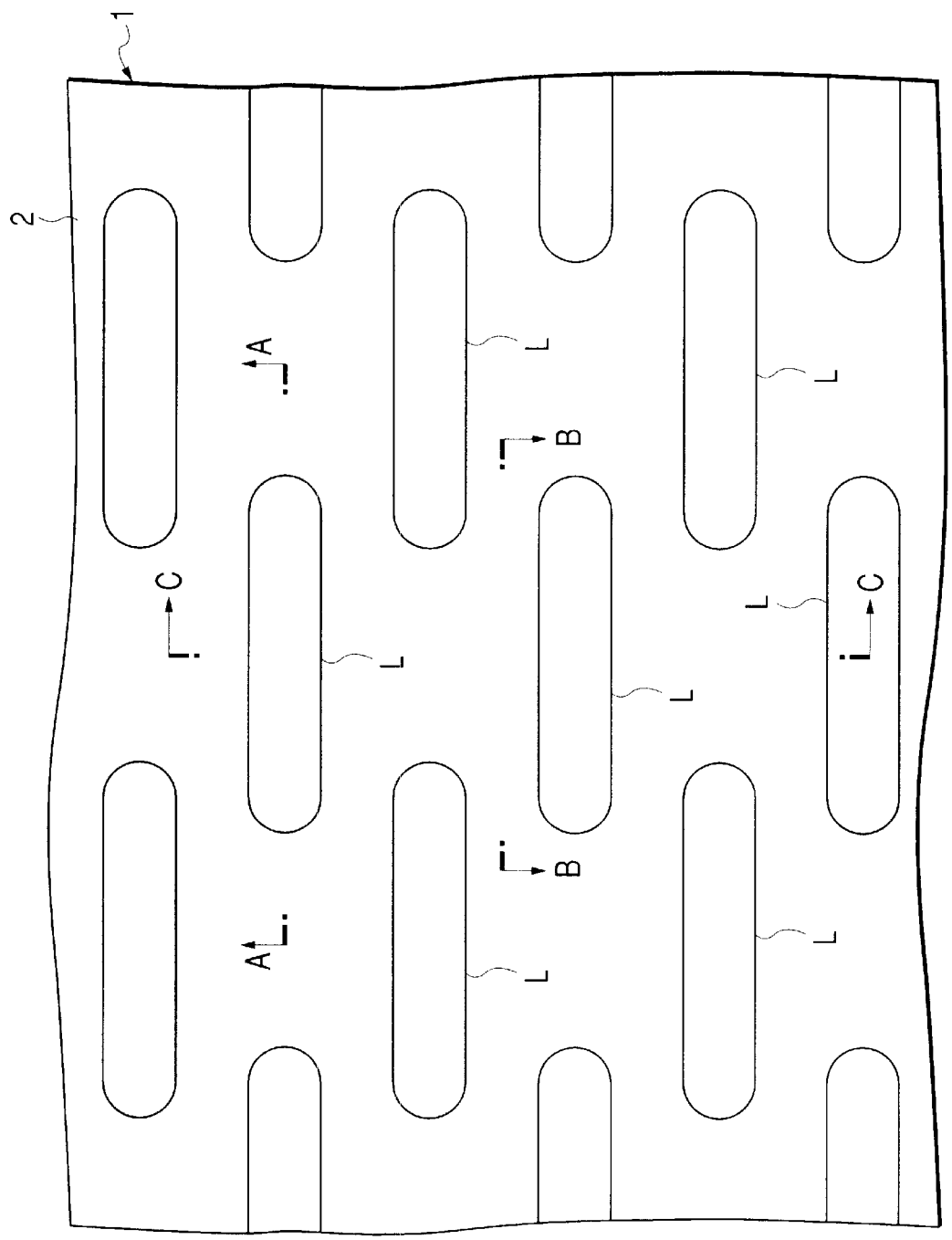
FIG. 5 is a plan view of a principal part of the semiconductor substrate, illustrating the process of producing the DRAM being one embodiment of the invention.

The above method forms the device isolation grooves 2 on the substrate 1 to thereby form the active regions L dotted as islands, surrounded by the device isolation grooves 2, as shown in FIG. 5. These active regions L have a substantially rectangular plane pattern that has long arms along the direction of the bit lines BL extending (in the right and left direction on the drawing). The length along the short arm of the active regions L, and the spacing between the adjoining active regions L, L along the short arm are almost equal to the minimum size (for example, 0.15 μm) that is determined by the resolution limit of the photolithography. The length along the long arm of the active regions L is about 0.75 μm.

Figure 6:
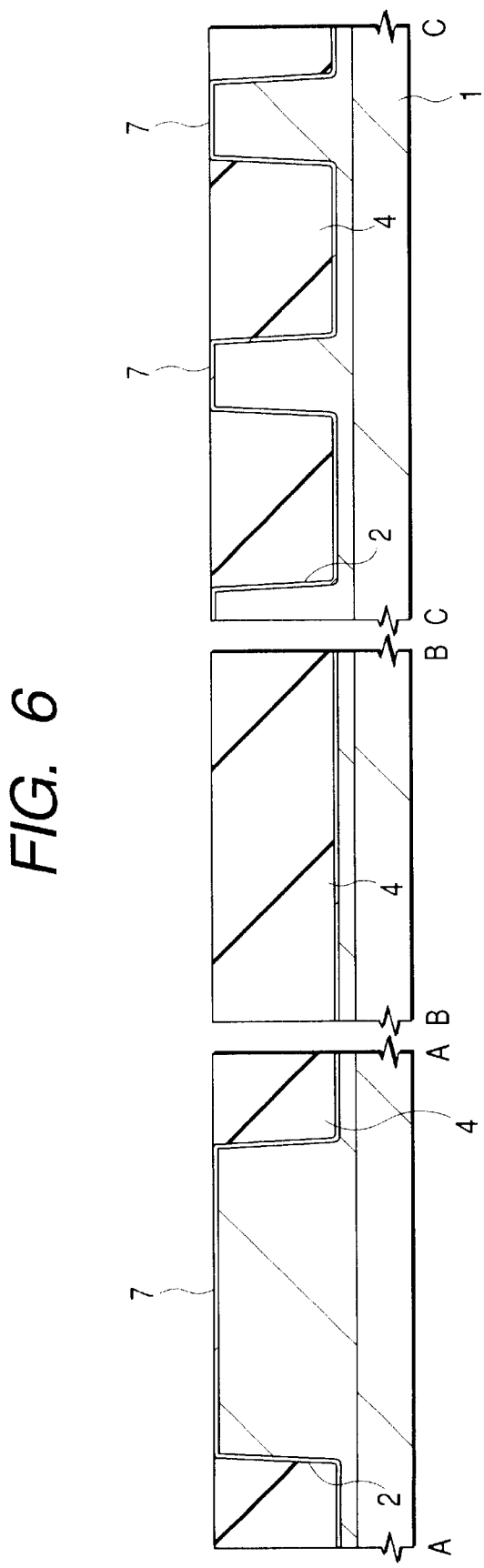
FIG. 6 is a sectional view of a principal part of the semiconductor substrate, illustrating the process of producing the DRAM being one embodiment of the invention.

Next, as shown in FIG. 6, the process moves to performing the ion implantation of the p-type impurities (boron) into the substrate 1, and then carrying out the heat processing under about 950° C. to defuse the impurities, thereby forming the p-type well 3. Further, after cleaning the surface of the substrate 1 (p-type well 3) with fluorine, the process goes to executing the heat processing under about 800 to 850° C., thereby forming the clean gate oxide film 7 of about 6 nm thick on the surface of the p-type well 3.

Figure 7:
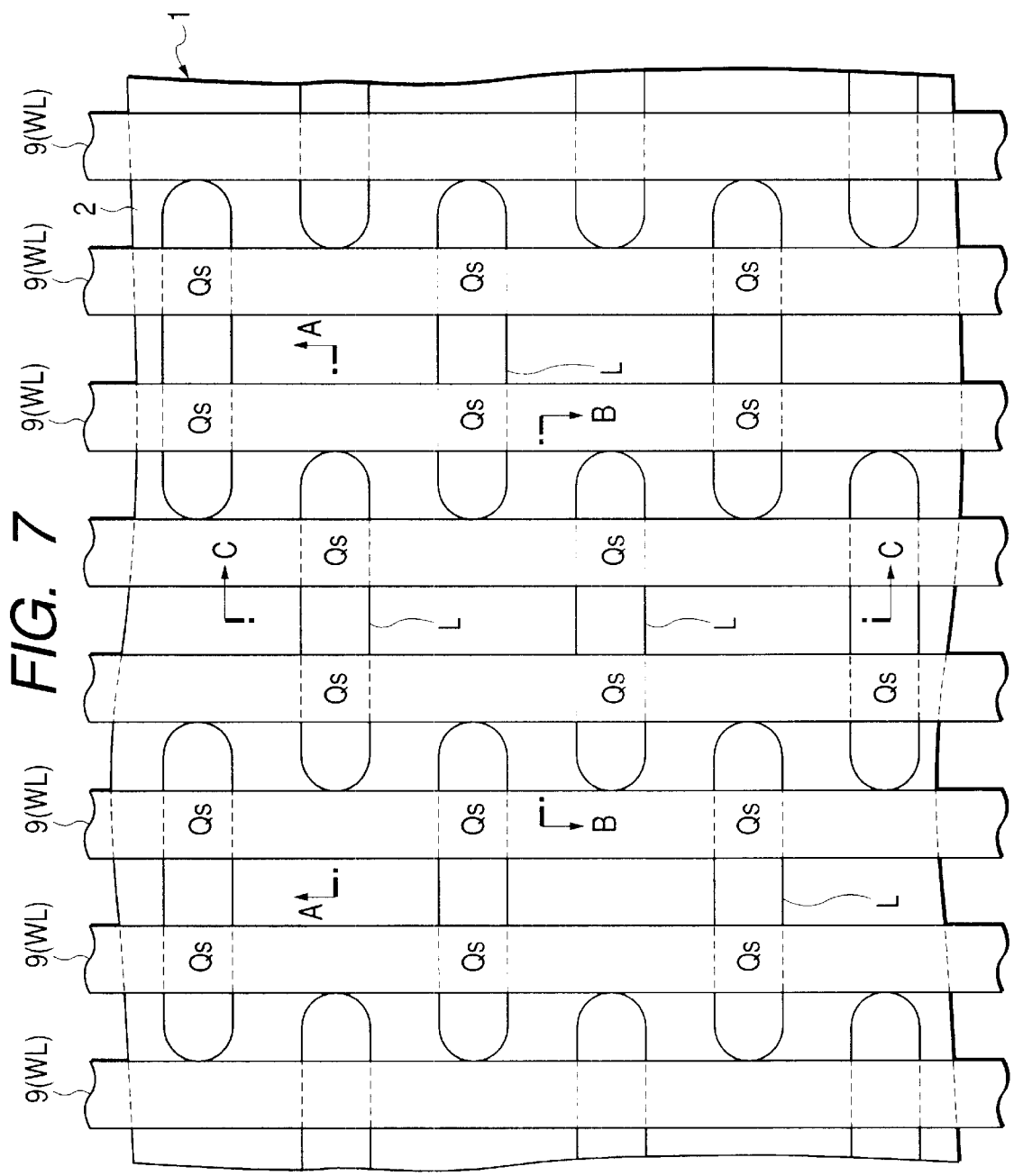
FIG. 7 is a plan view of a principal part of the semiconductor substrate, illustrating the process of producing the DRAM being one embodiment of the invention.
Figure 8:
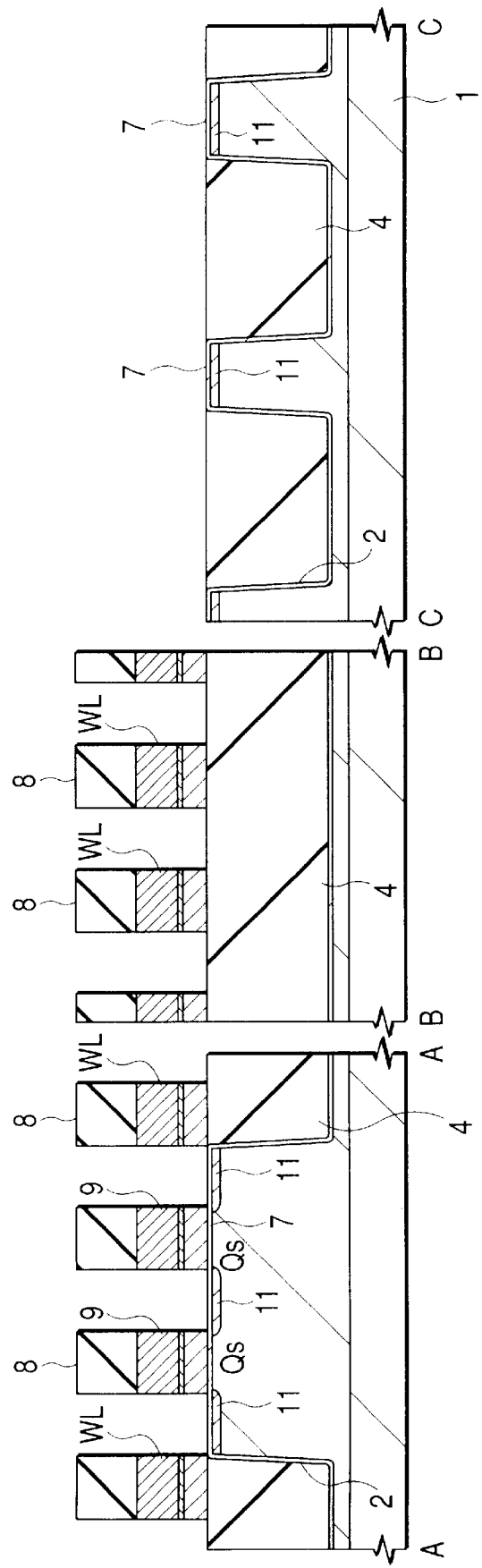
FIG. 8 is a sectional view of a principal part of the semiconductor substrate, illustrating the process of producing the DRAM being one embodiment of the invention.

Next, as shown in FIG. 7 and FIG. 8, the process moves to forming the gate electrodes 9 over the gate oxide film 7, thereafter performing the ion implantation of the n-type impurities (phosphorus or arsenic) into the substrate 1 (p-type well 3) on both sides of the gate electrodes 9, thereby forming the n-type semiconductor regions 11 (sources, drains) The processes to this stage complete to form the memory cell selecting MISFETs Qs constituting a part of the memory cell.

In order to form the gate electrodes 9 (word lines WL), there needs, for example, depositing a low-resistance polycrystal silicon film of about 70 nm thick, with a phosphorous (P) doped on the gate oxide film 7 by the CVD method, then depositing the WN film of about 5 nm thick and the W film of about 80 nm thick, to overlie the polycrystal silicon film by the spattering method, further depositing the silicon nitride film 8 to overlie them by the CVD method, and thereafter patterning these films by the dry etching with a photo-resist film (not illustrated) served as the mask. The width (gate length) and the spacing of the gate electrodes 9 (word lines WL) are each equal to the minimum size (0.15 μm) that is determined by the resolution limit of the photolithography.

Figure 9:
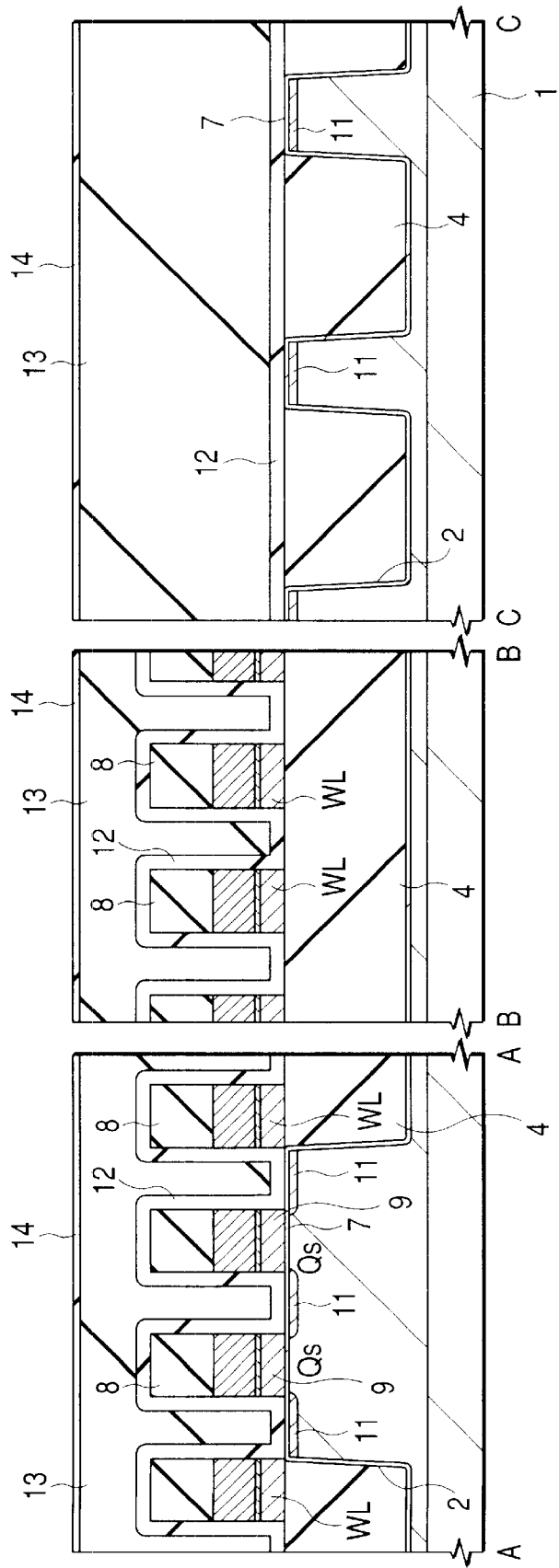
FIG. 9 is a sectional view of a principal part of the semiconductor substrate, illustrating the process of producing the DRAM being one embodiment of the invention.

Next, as shown in FIG. 9, the process deposits the silicon nitride film 12 on the substrate 1 by the CDV method. The silicon nitride film 12 is deposited to such a film thickness (for example, about 50 nm to 100 nm) that the spacing between the gate electrodes 9 (word lines WL) is not buried.

Then, there needs depositing the silicon oxide film 13 of about 700 nm to 800 nm thick by the CDV method to overlie the silicon nitride film 12, polishing the silicon oxide film 13 chemically and mechanically to flatten the surface thereof, and depositing the silicon oxide film 14 of about 100 nm thick by the CDV method over the silicon oxide film 13. The silicon oxide film 14 is formed to mend fine flaws on the surface of the silicon oxide film 13, which have been created through the polishing.

Figure 10:
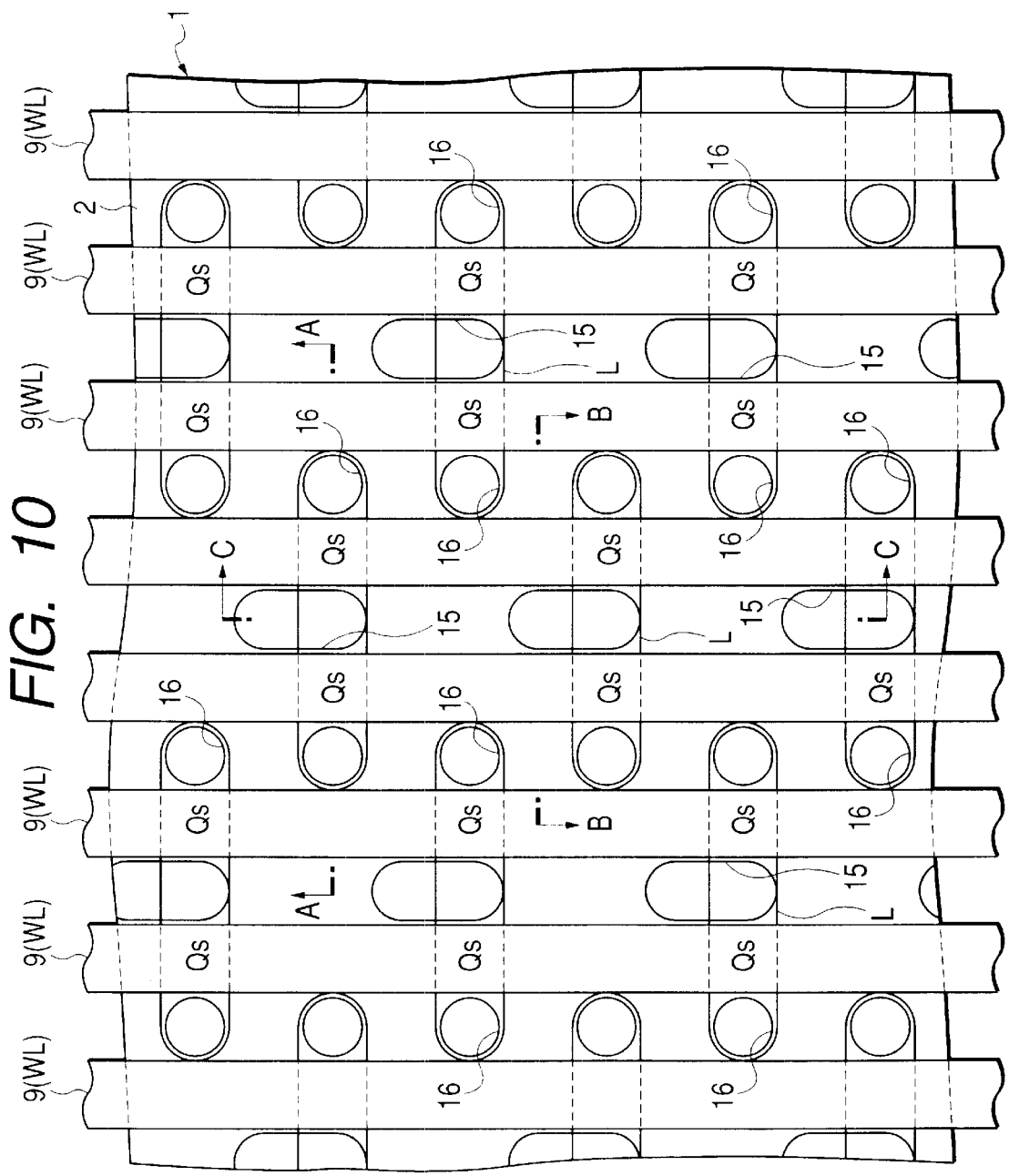
FIG. 10 is a plan view of a principal part of the semiconductor substrate, illustrating the process of producing the DRAM being one embodiment of the invention.
Figure 11:
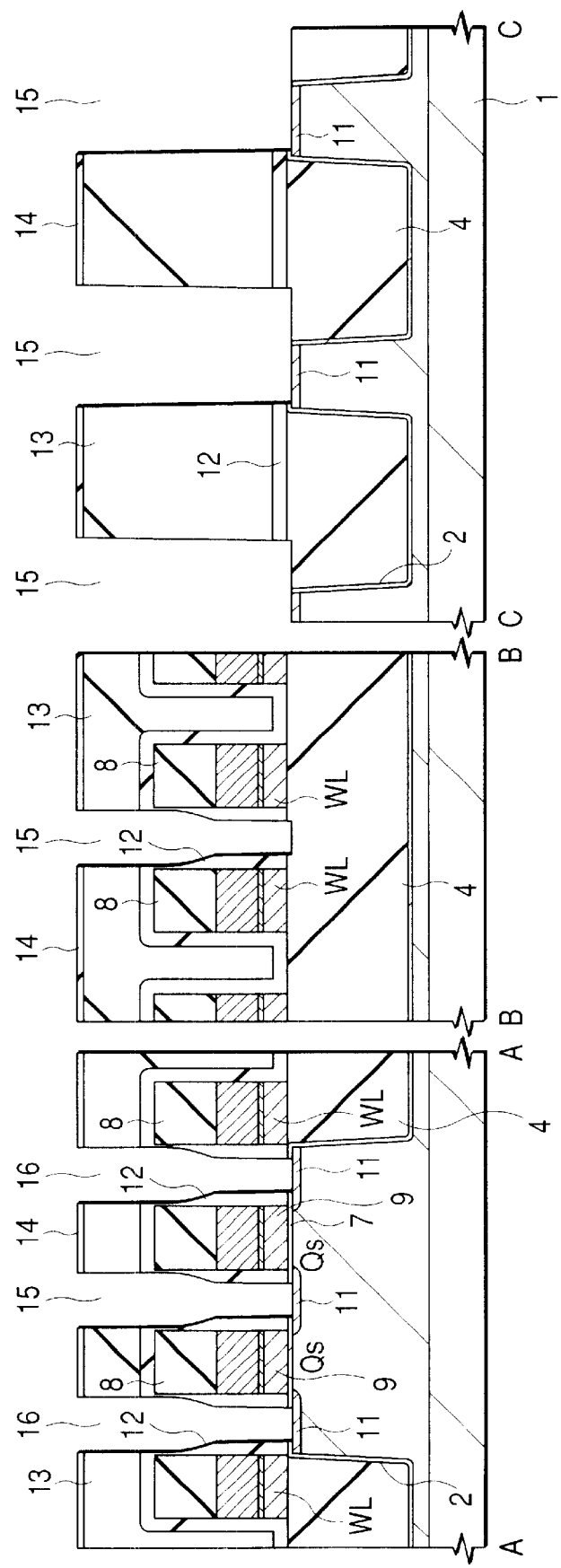
FIG. 11 is a sectional view of a principal part of the semiconductor substrate, illustrating the process of producing the DRAM being one embodiment of the invention.

Next, as shown in FIG. 10 and FIG. 11, the process needs applying a dry etching to the silicon oxide films 14, 13 with a photo-resist film (not illustrated) served as the mask, and further applying a dry etching to the silicon nitride film 12 to thereby form the contact holes 15, 16 over the n-type semiconductor regions 11, 11 (sources, drains) of the memory cell selecting MISFETs Qs.

The etching of the silicon oxide films 14, 13 is carried out under such a condition that the etching rate of the silicon oxide is greater than that of the silicon nitride, so that the bedding silicon nitride film 12 cannot be removed. On the other hand, the etching of the silicon nitride film 12 is carried out under such a condition that the etching rate of the silicon nitride is greater than that of the silicon oxide, so that the surface of the silicon oxide film 4 embedded into the device isolation groove 2 cannot be washed out deeply. Also, the etching is performed under a condition of applying an anisotropic etching to the silicon nitride film 12, so as to leave the silicon nitride film 12 on the side walls of the gate electrodes 9 (word lines WL). Such an etching method makes it possible to form the contact holes 15, 16 having a finer diameter than the minimum size that is determined by the resolution limit of the photolithography, thanks to the self-alignment function to the gate electrodes 9 (word lines WL).

The contact holes 15 for connecting the bit lines BL and the n-type semiconductor regions 11 of the contact holes 15, 16 are formed in a virtually rectangular plane pattern that has long sides along the direction of the word lines WL extending, and a part of them extend to the upper part of the device isolation grooves 2, running off from the active regions L. On the other hand, the contact holes 16 for connecting the data storing capacitors C and the n-type semiconductor regions 11 have the vertical diameter that is equal to the horizontal diameter. The diameters of the upper parts of the contact holes 15, 16 (the diameter in the short side direction, in case of the contact hole 15) each are almost equal to the minimum size (0.15 μm) that is determined by the resolution limit of the photolithography.

Figure 12:
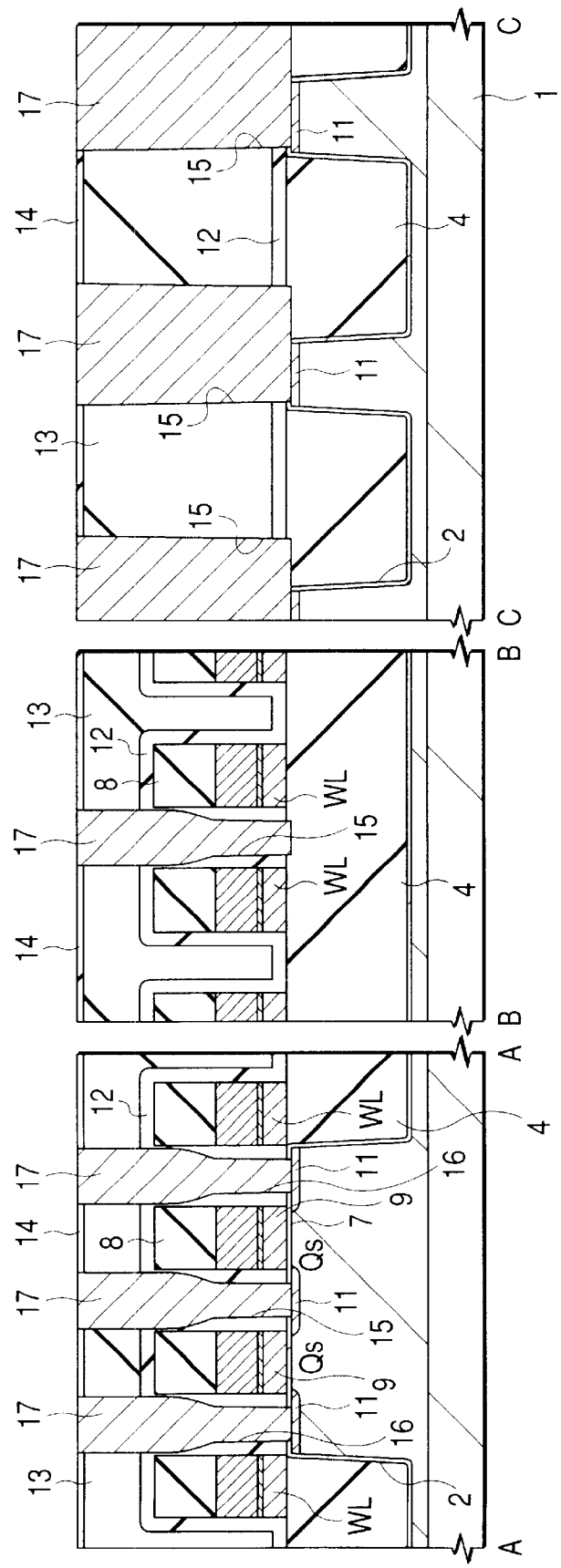
FIG. 12 is a sectional view of a principal part of the semiconductor substrate, illustrating the process of producing the DRAM being one embodiment of the invention.

Next, as shown in FIG. 12, the process forms the plugs 17 inside the contact holes 15, 16. The forming of the plugs 17 needs depositing a low-resistance polycrystal silicon film with n-type impurities such as a phosphor (P) doped, by the CDV method over the silicon oxide film 14 including the insides of the contact holes 15, 16, and then etching back the polycrystal silicon film over the silicon oxide film 14 to leave it only inside the contact holes 15, 16.

Figure 13:
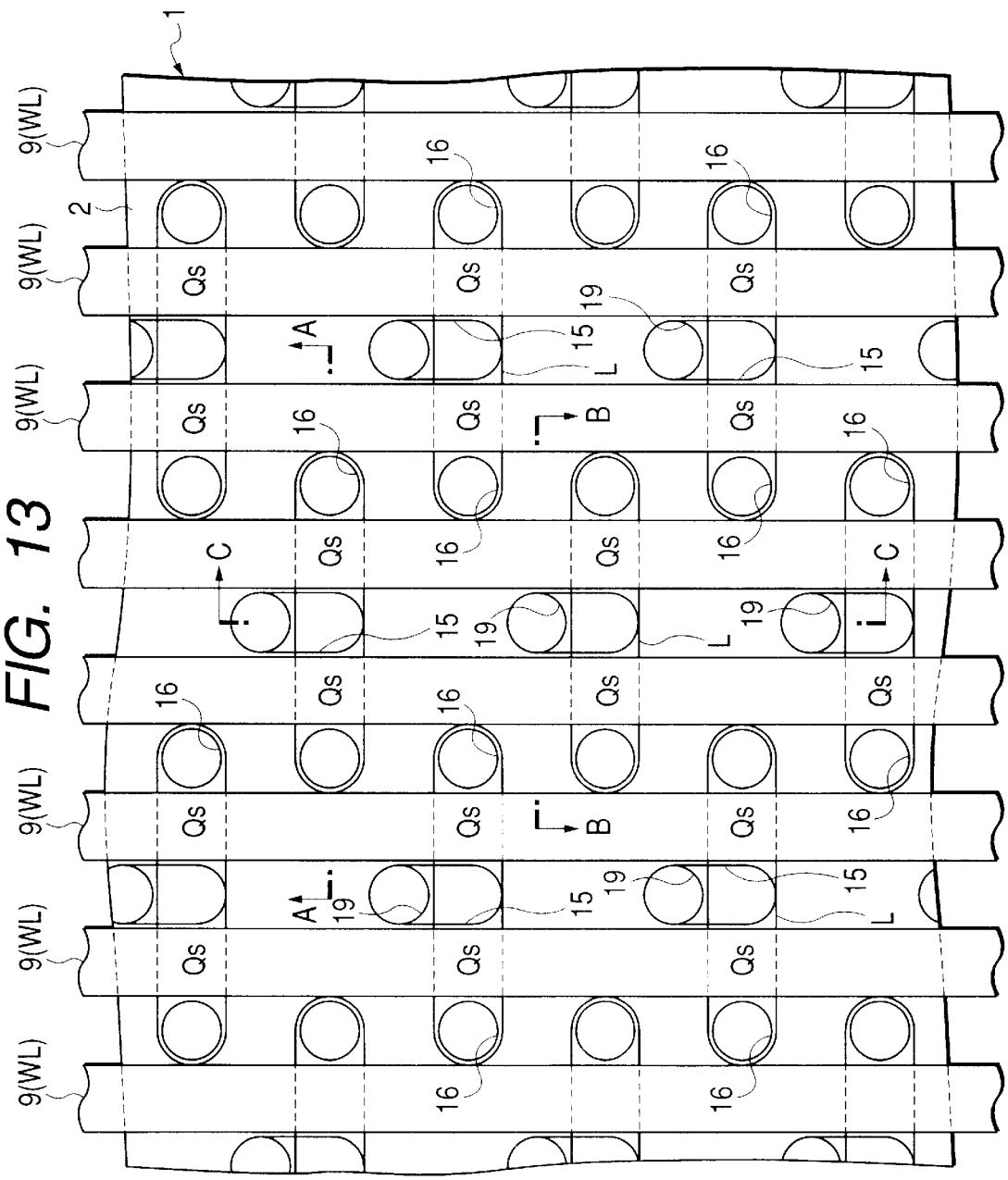
FIG. 13 is a plan view of a principal part of the semiconductor substrate, illustrating the process of producing the DRAM being one embodiment of the invention.
Figure 14:
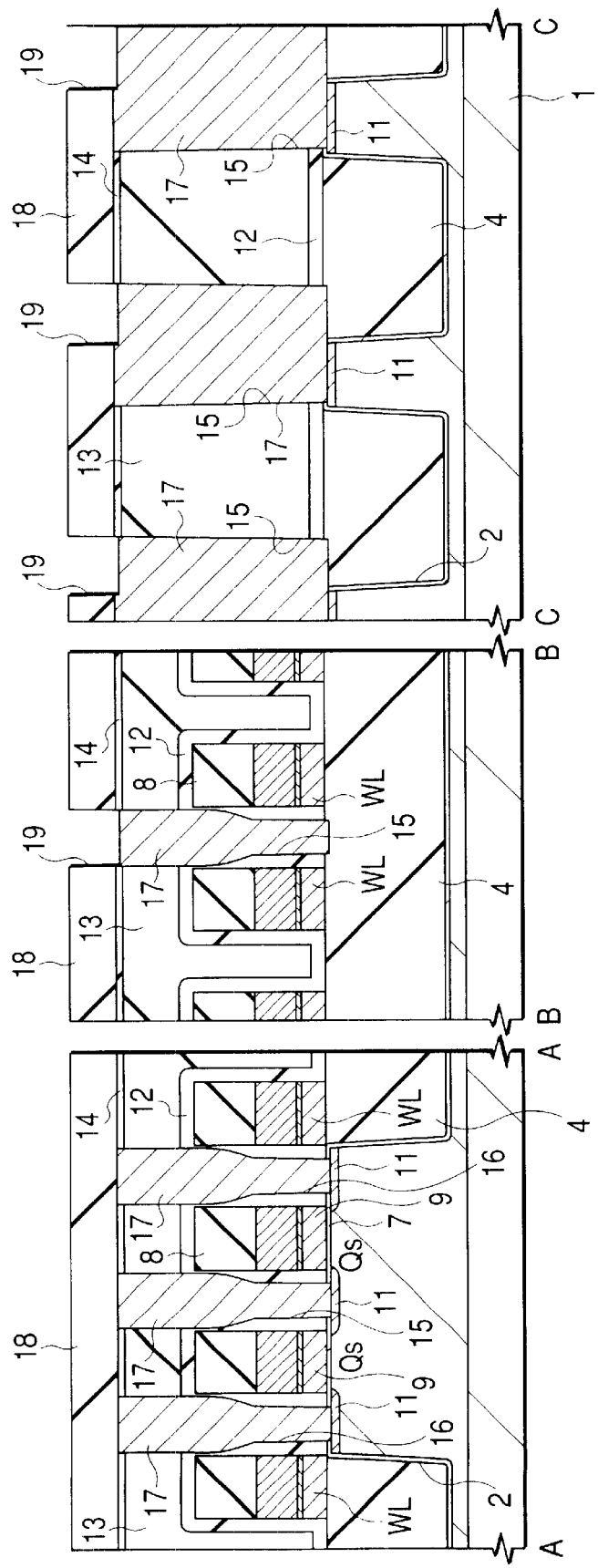
FIG. 14 is a sectional view of a principal part of the semiconductor substrate, illustrating the process of producing the DRAM being one embodiment of the invention.

Next, as shown in FIG. 13 and FIG. 14, the process goes to depositing the silicon oxide film 18 of about 200 nm thick on the silicon oxide film 14 by the CDV method, and then forming the through holes 19 on the silicon oxide film 18 over the contact holes 15 by means of the dry etching with a photo-resist film (not illustrated) served as the mask.

Figure 15:
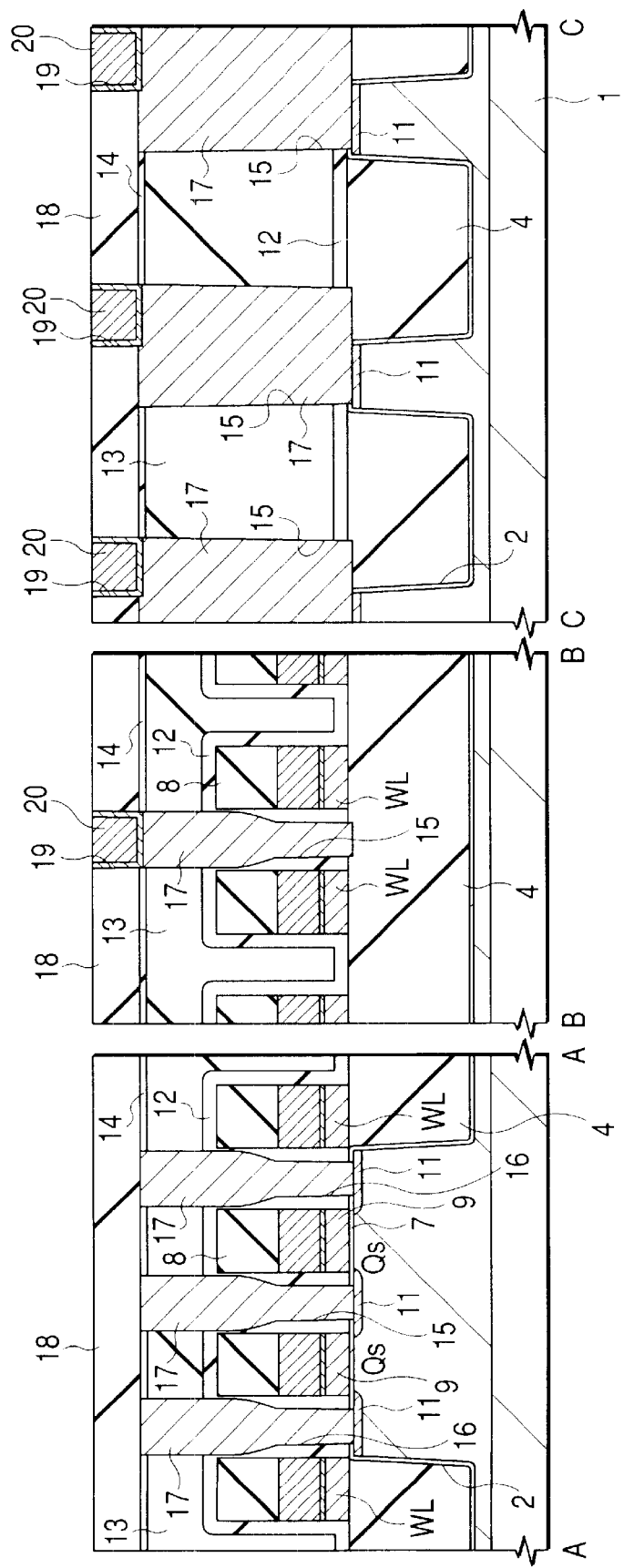
FIG. 15 is a sectional view of a principal part of the semiconductor substrate, illustrating the process of producing the DRAM being one embodiment of the invention.

Next, as shown in FIG. 15, the process forms the plugs 20 inside the through holes 19. The forming of the plugs 20 needs depositing Ti (titanium) film, TiN film, and W film over the silicon oxide film 18 including the insides of the through holes 19, by the spattering method and the CDV method, and thereafter removing the Ti film, TiN film, and W film on the silicon oxide film 18 by etching back (or polishing chemically and mechanically) to leave these films only inside the through holes 19.

Figure 16:
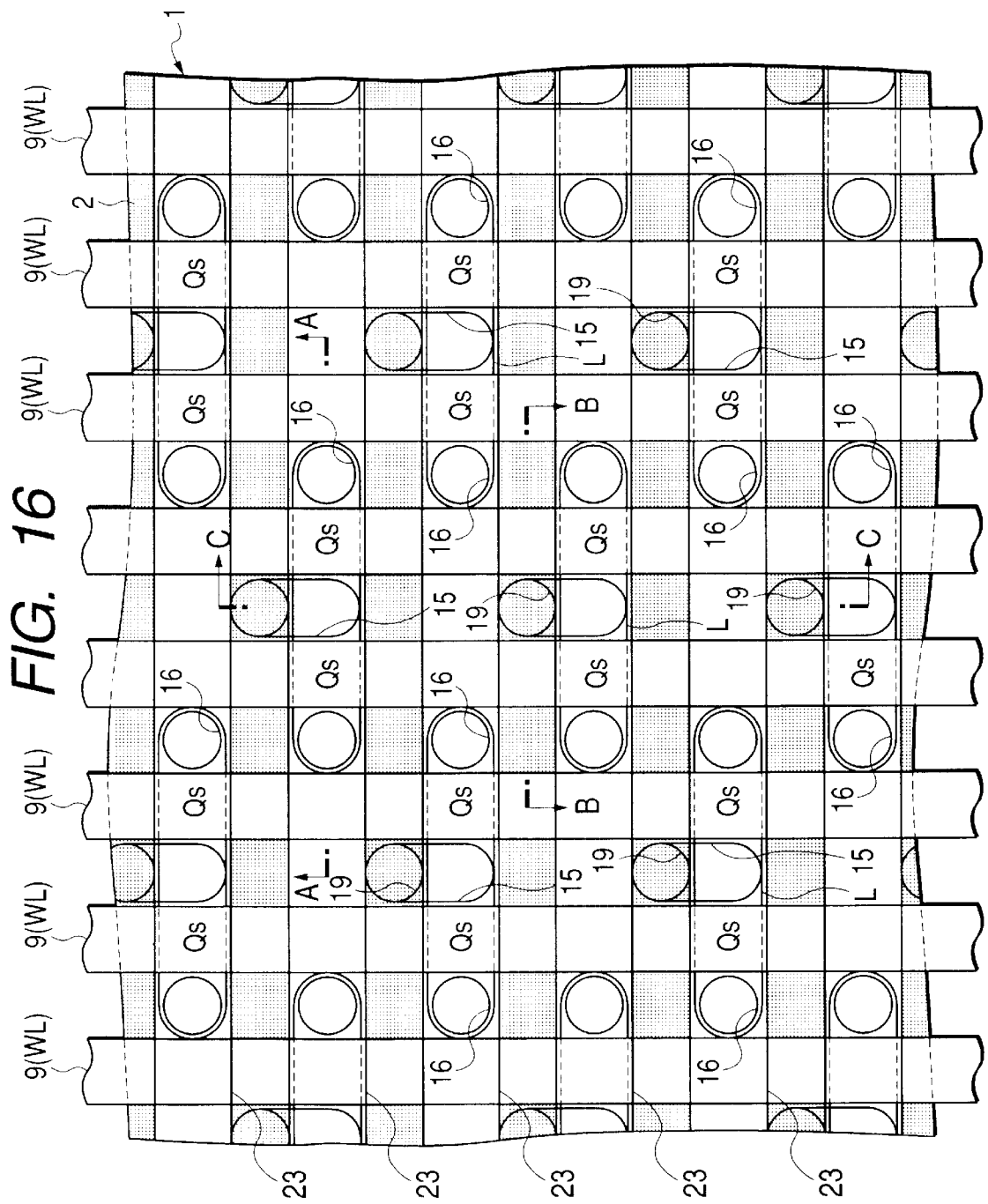
FIG. 16 is a plan view of a principal part of the semiconductor substrate, illustrating the process of producing the DRAM being one embodiment of the invention.
Figure 17:
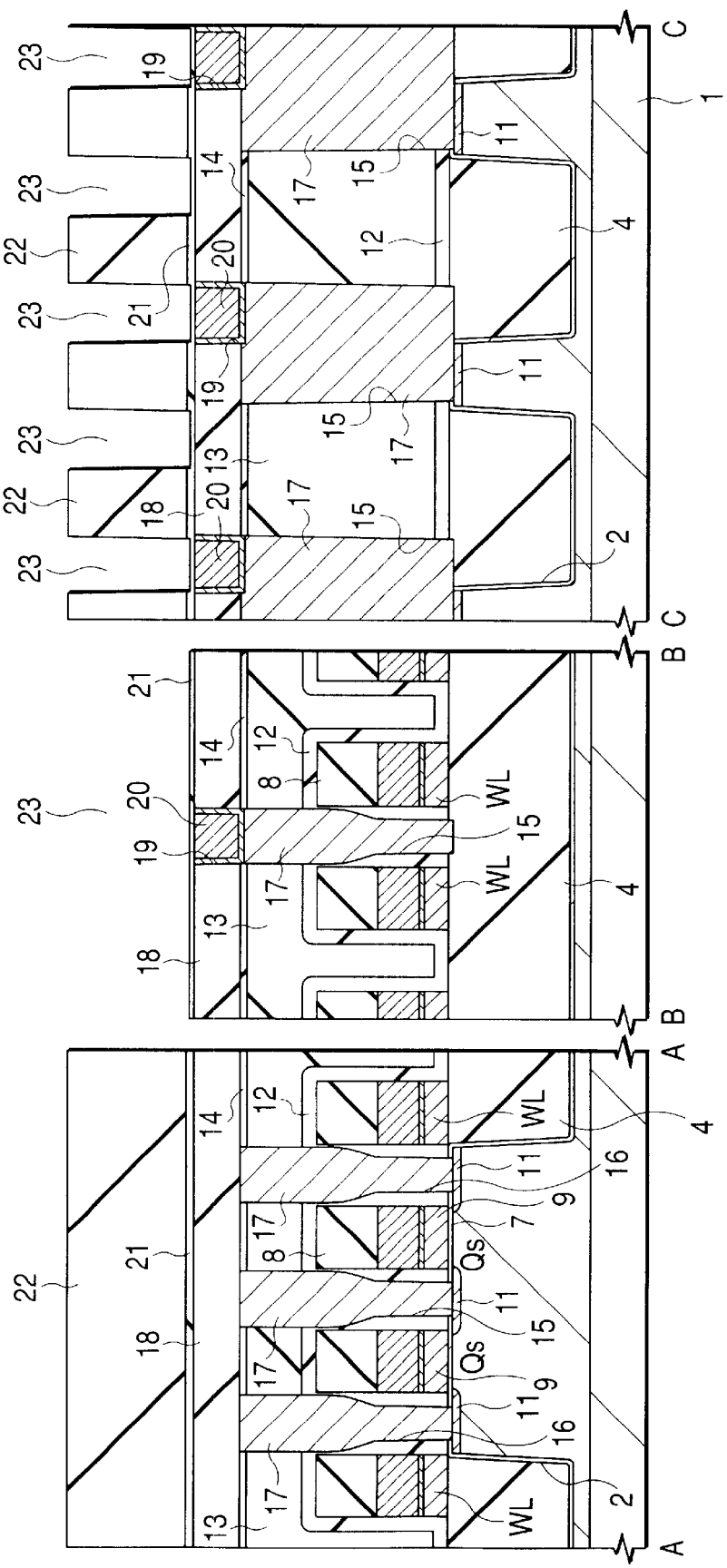
FIG. 17 is a sectional view of a principal part of the semiconductor substrate, illustrating the process of producing the DRAM being one embodiment of the invention.

Next, as shown in FIG. 16 and FIG. 17, there needs depositing the silicon nitride film 21 of about 40 nm thick and the silicon oxide film 22 of about 300 nm thick over the silicon oxide film 18 by the CDV method, and then forming the wiring grooves 23 on the silicon oxide film 22 being the areas for the bit lines by means of the dry etching with a photo-resist film (not illustrated) served as the mask. The etching of the silicon oxide film 22 is carried out under such a condition that the etching rate of the silicon oxide is greater than that of the silicon nitride, so that the bedding silicon nitride film 21 cannot be removed. The width of the wiring grooves 23 is almost equal to the minimum size (0.15 $\mu$m) that is determined by the resolution limit of the photolithography.

Figure 18:
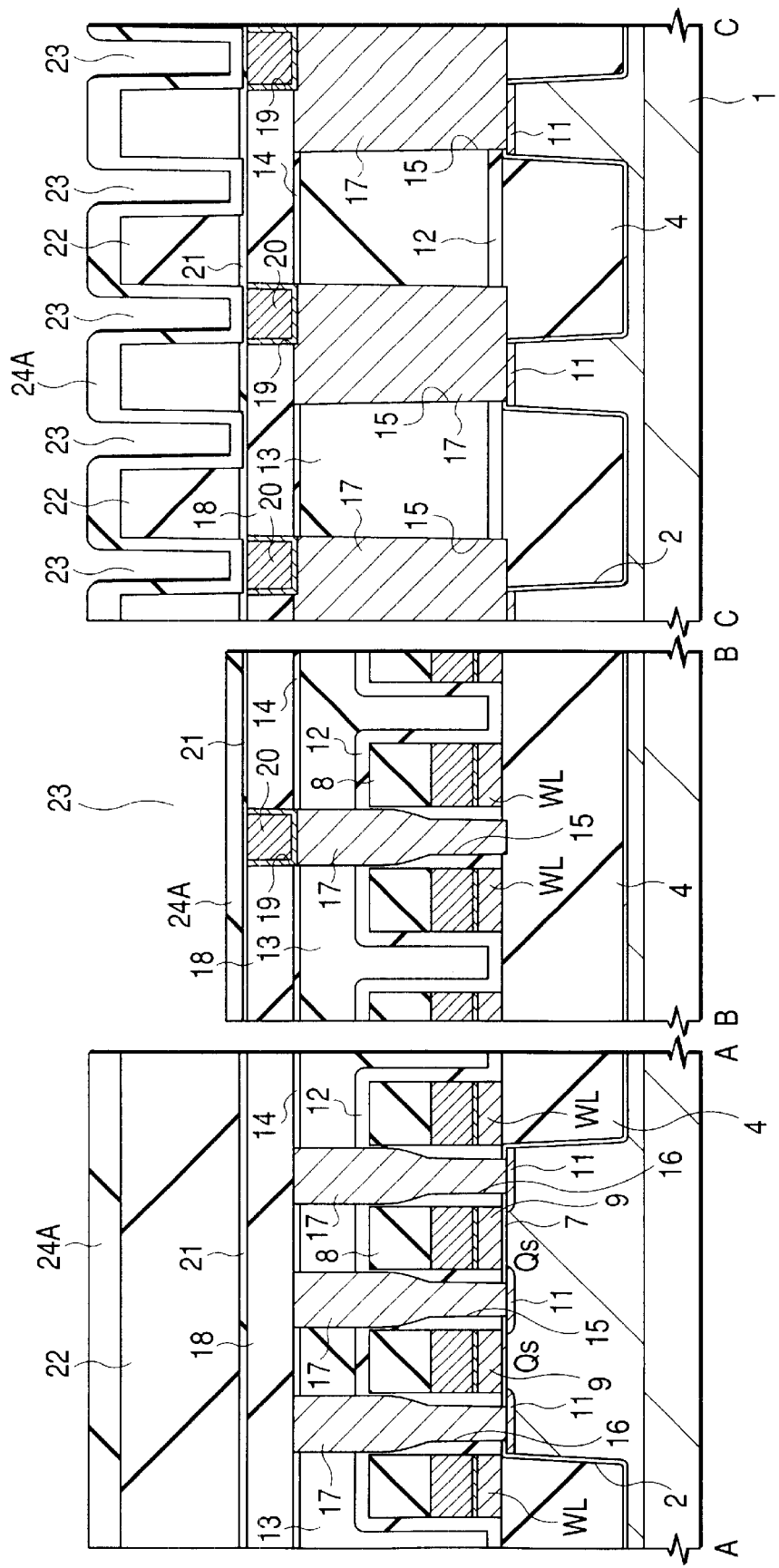
FIG. 18 is a sectional view of a principal part of the semiconductor substrate, illustrating the process of producing the DRAM being one embodiment of the invention.

Next, as shown in FIG. 18, the process deposits a silicon oxide film 24A over the silicon oxide film 22 including the insides of the wiring grooves 23 by the CDV method. The silicon oxide film 24A is deposited in such a film thickness that the insides of the wiring grooves 23 are not completely buried, that is, in a film thickness being thinner than half the width of the wiring grooves 23.

Figure 19:
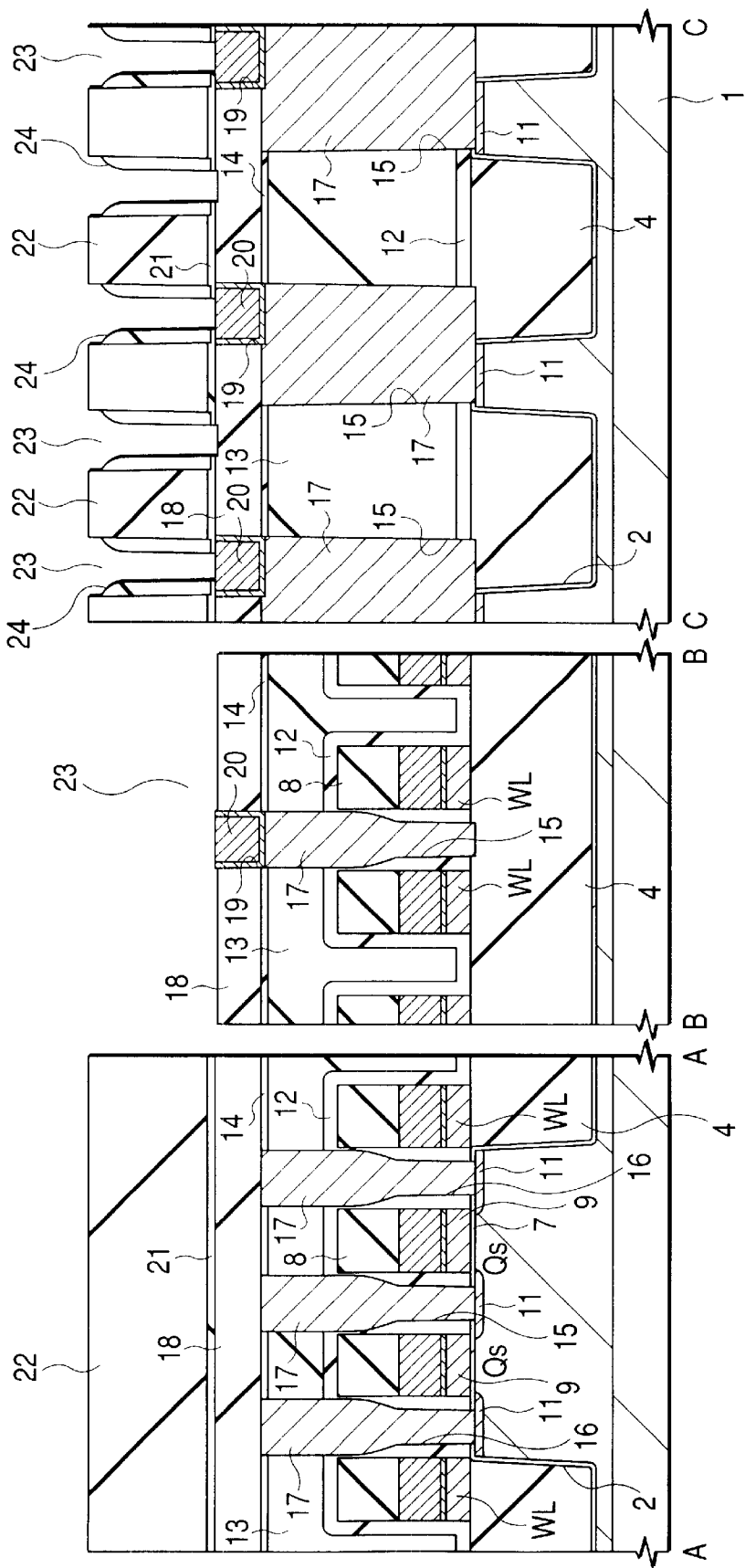
FIG. 19 is a sectional view of a principal part of the semiconductor substrate, illustrating the process of producing the DRAM being one embodiment of the invention.

Next, as shown in FIG. 19, the process needs applying the anisotropic etching to the silicon oxide film 24A to thereby form the side wall spacers 24 made of the silicon oxide film 24A on the side wall of the wiring grooves 23, and then etching the silicon nitride film 21 on the bottom of the wiring grooves 23 to thereby expose the surface of the plugs 20 inside the through holes 19. Thus, the forming of the side wall spacers 24 on the side walls of the wiring grooves 23 will make the effective width of the wiring grooves 23 narrower than the minimum size (0.15 $\mu$m) that is determined by the resolution limit of the photolithography (for example, 0.1 $\mu$m to 0.08 $\mu$m).

Figure 20:
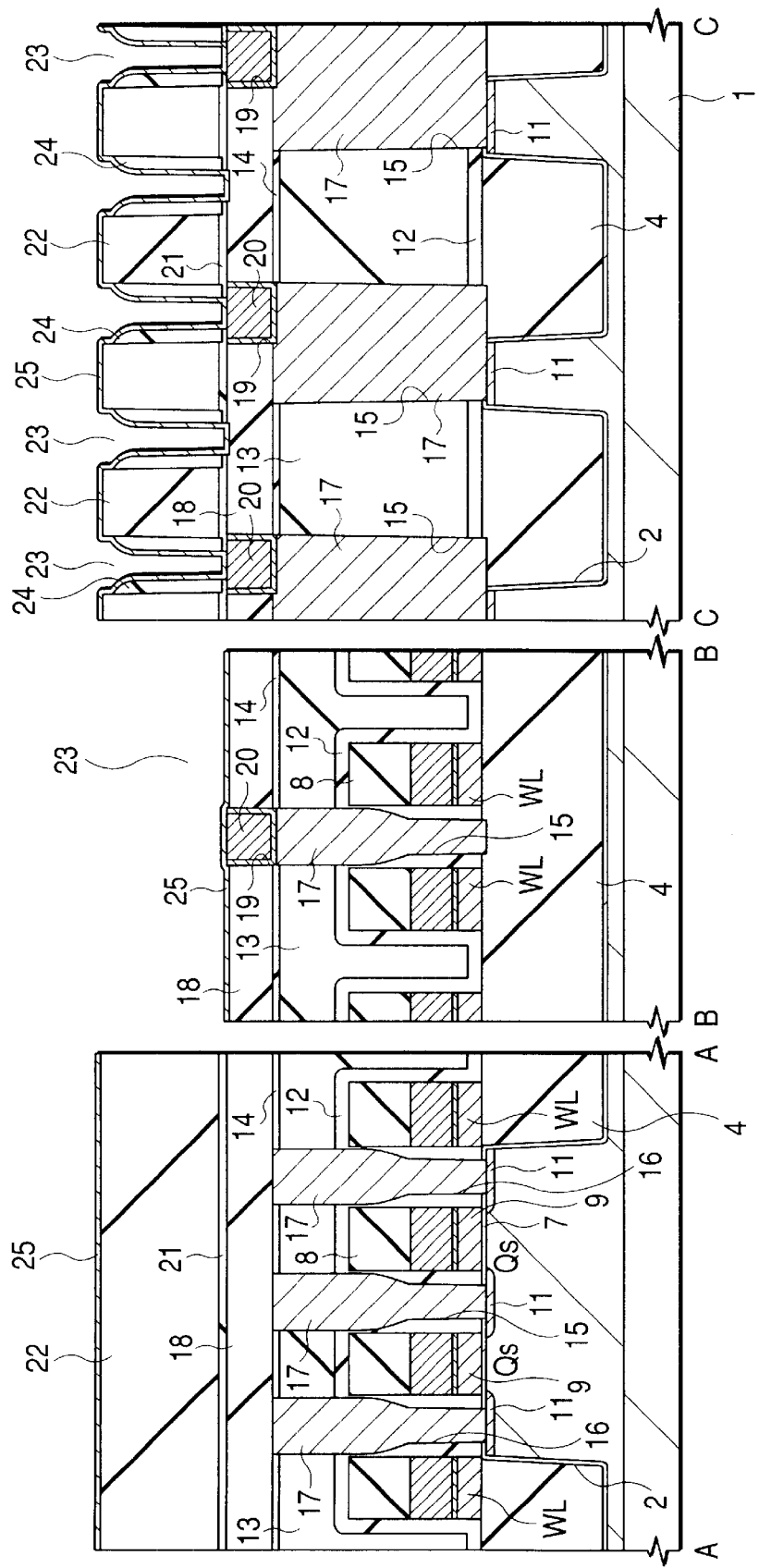
FIG. 20 is a sectional view of a principal part of the semiconductor substrate, illustrating the process of producing the DRAM being one embodiment of the invention.
Figure 21:
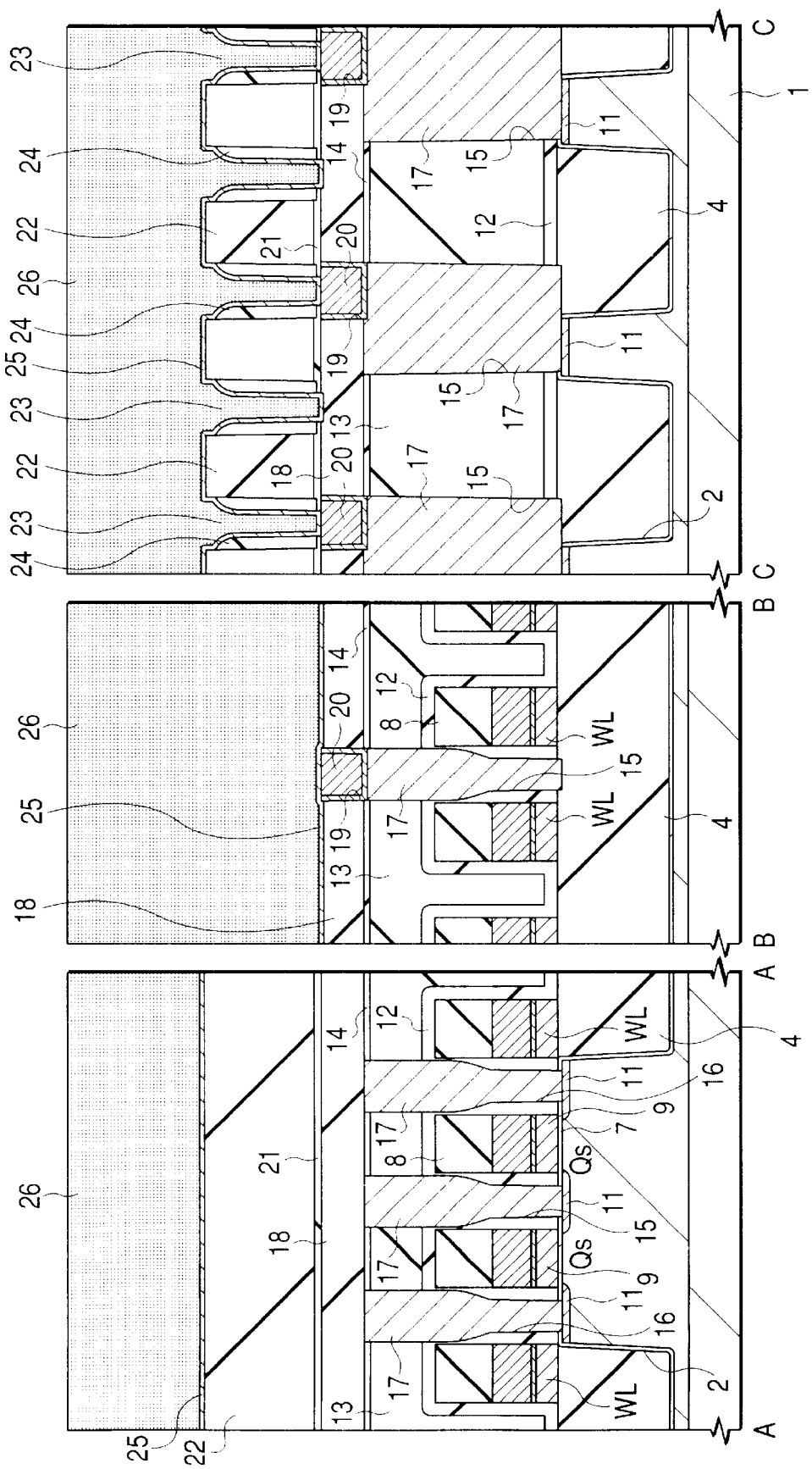
FIG. 21 is a sectional view of a principal part of the semiconductor substrate, illustrating the process of producing the DRAM being one embodiment of the invention.

Next, as shown in FIG. 20, the process needs depositing the TiN film 25 having a thin film thickness about 7 nm on the silicon oxide film 22 including the insides of the wiring grooves 23 by the spattering method, and then, as shown in FIG. 21, depositing a W film 26 having a thick film thickness about 700 nm to 800 nm on the TiN film 25 including the insides of the wiring grooves 23 by the CDV method.

Figure 22:
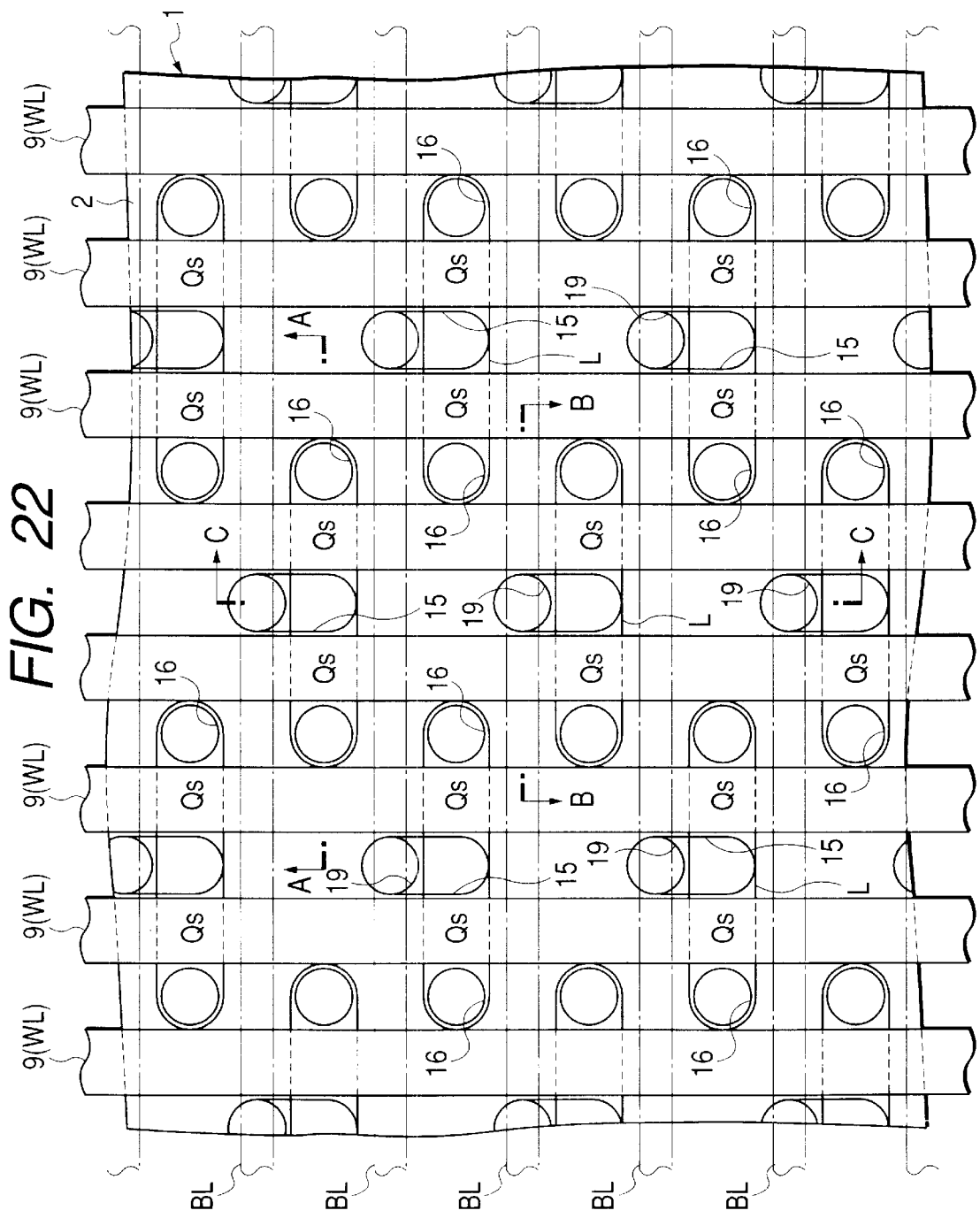
FIG. 22 is a plan view of a principal part of the semiconductor substrate, illustrating the process of producing the DRAM being one embodiment of the invention.
Figure 23:
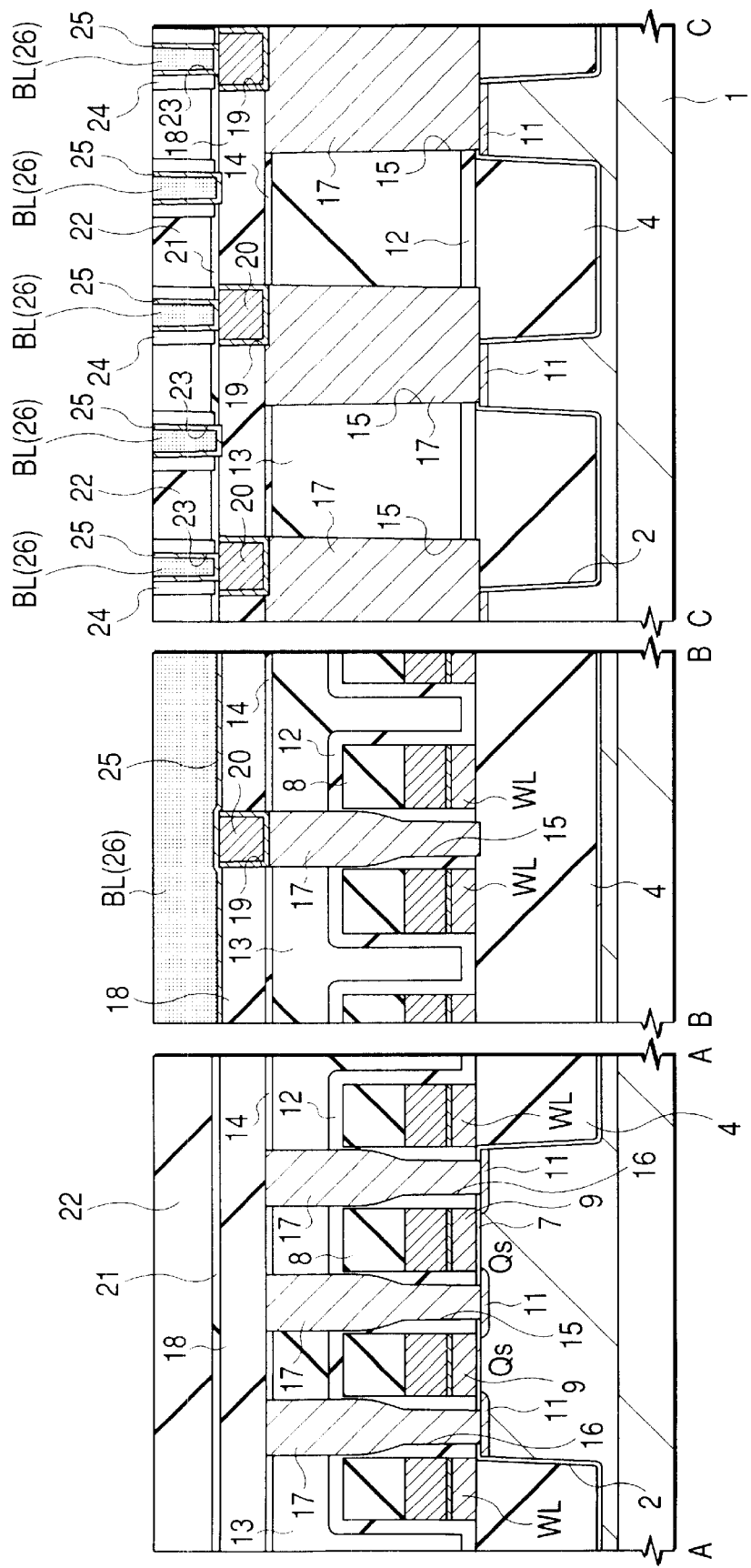
FIG. 23 is a sectional view of a principal part of the semiconductor substrate, illustrating the process of producing the DRAM being one embodiment of the invention.

Next, as shown in FIG. 22 and FIG. 23, the forming of the bit lines BL inside the wiring grooves 23 needs polishing the W film 26 and the TiN film 25 over the silicon oxide film 22 chemically and mechanically to remove them, thereby leaving these films only inside the wiring grooves 23. To prevent short-circuiting between the adjoining bit lines BL, BL, the polishing process, after polishing the W film 26 and the TiN film 25 over the silicon oxide film 22, performs polishing the bedding silicon oxide film 22 and the side wall spacers 24 to a certain degree to retreat them downward. The retreat of the silicon oxide film 22 and the side wall spacers 24 is specified as a level such that the thinning part of the film thickness on the upper end of the side wall spacers 24 is eliminated.

Figure 24:
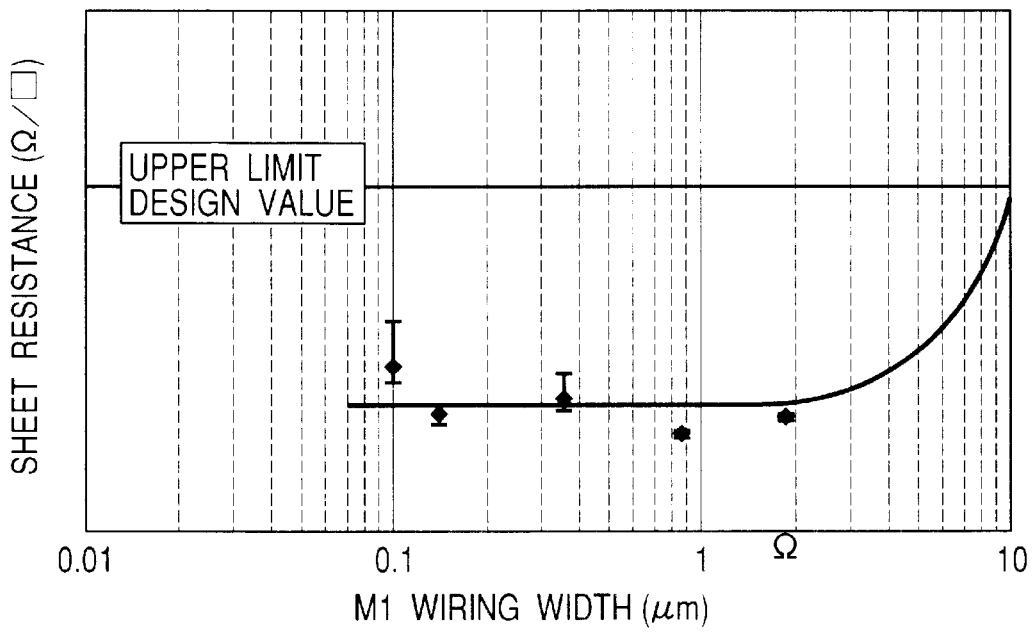
FIG. 24 is a graph illustrating the dependence of a sheet resistance on the line width of a bit line formed by the method of the invention.
Figure 25:
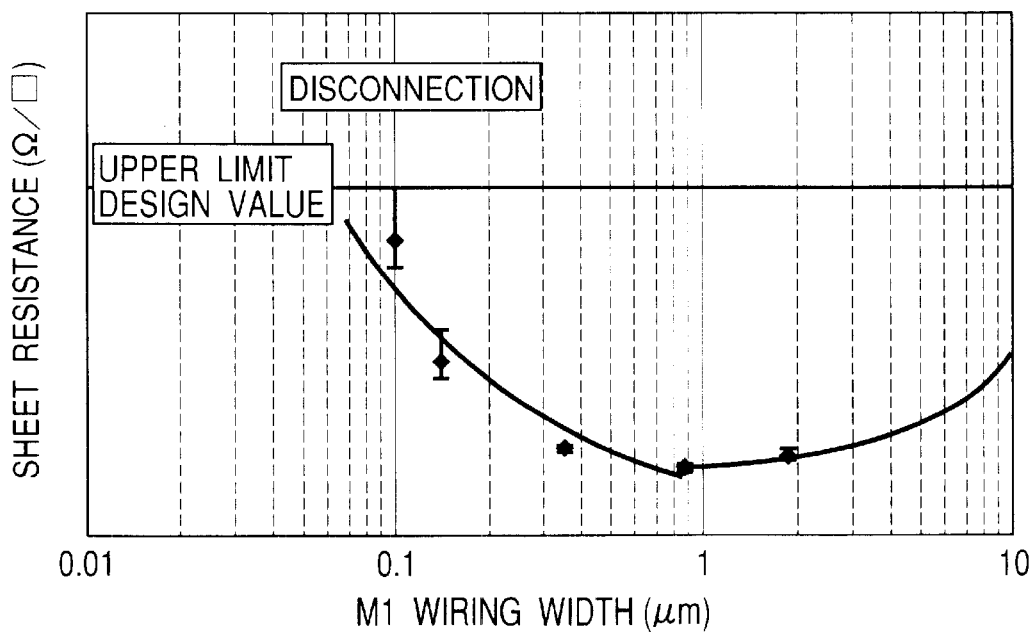
FIG. 25 is a graph illustrating the dependence of a sheet resistance on the line width of a bit line formed by the method of a comparison example.

FIG. 24 and FIG. 25 show the graphs acquired by measuring the variations of the sheet resistance, when the width of the bit lines BL formed insides the wiring grooves 23 is thinned by stages from 2 $\mu$m. FIG. 24 represents a case in which the TiN film 25 is formed between the side wall spacers 24 and the bit lines BL, and FIG. 25 represents a case in which the side wall spacers 24 made of silicon oxide and the bit lines BL made of W are directly brought into contact, instead of forming the TiN film 25.

As shown in FIG. 24, in case of the TiN film 25 being formed between the side wall spacers 24 and the bit lines BL, there was not any increase of the sheet resistance observed, when the width of the bit lines BL was narrowed to about 0.1 $\mu$m. As shown in FIG. 25 on the other hand, in case of the side wall spacers 24 and the bit lines BL being directly brought into contact, the sheet resistance gradually increased when the width of the bit lines BL was narrower than 1 $\mu$m, and there occurred disconnections when it was narrower than 0.2 $\mu$m. This finds that there occur local strippings on the boundary faces between the side wall spacers 24 and the bit lines BL, when the width of the bit lines BL is less than 1 $\mu$m, and that there occur strippings all over the areas of the wiring grooves 23, when the width is narrower than 0.2 $\mu$m.

Such strippings are created by the internal stress of the W film 26. Especially, in case of the wiring length being extremely long against the wiring width, such as the case with the bit lines BL of a DRAM, as the stripping propagates, the stress concentrates on the W film 26 located on the center of the stripped area, which at last leads to disconnections of the bit lines BL.

In contrast, when the TiN film 25 was inserted between the side wall spacers 24 and the bit lines BL, even if the width of the bit lines BL was narrowed to about 0.1 $\mu$m, the side wall spacers 24 and the TiN film 25 adhered closely on the boundary faces thereof almost all over the areas of the wiring grooves 23.

Thus, the insertion of the TiN film 25 whose adhesive strength to the silicon oxide is greater than W between the side wall spacers 24 made of the silicon oxide and the W film 26 makes it possible to prevent strippings on the boundary faces between the side wall spacers 24 and the W film 26, even when the width of the wiring grooves 23 becomes less than 0.1 $\mu$m, which leads to preventing an increase of the sheet resistance and disconnections of the bit lines BL. As the adhesive layer to be inserted between the side wall spacers 24 and the W film 26, the metal nitride compound such as TaN, WN, or ZrN other than TiN exhibits the effectiveness.

A better adhesiveness of the metal nitride compound to the silicon oxide is conceived to result from that an interface layer of a metal oxide compound is produced between the metal nitride compound and the silicon oxide, and this interface layer enhances the adhesiveness between both. In comparison to this, a poor adhesiveness between W and the silicon oxide is conceived to originate in that a tungsten oxide created on the interface between both is a sublimate compound, which lowers the adhesiveness between both.

The aforementioned bit lines BL are formed inside the side wall spacers 24 that are formed on the side walls of the wiring grooves 23 formed on the silicon oxide film 22. Accordingly, the width of the bit lines BL is defined by the film thickness of the silicon oxide film 24A forming the side wall spacers 24. In other words, the width of the bit lines BL can easily be controlled by controlling the film thickness of the silicon oxide film 24A that is deposited by the CVD method. Therefore, according to the method of forming the bit lines relating to the embodiment, it is possible to form the bit lines finer than the minimum size that is determined by the resolution limit of the photolithography, with a high dimensional accuracy.

The bit lines BL formed in this manner have the width finer than the minimum size that is determined by the resolution limit of the photolithography. Therefore, even in a still shrunk memory size, a joint margin between the bit lines BL and through holes 34 that is formed on the subsequent process on an area between the bit lines BL, BL can be secured sufficiently, and short-circuits between the bit lines BL and plugs 35 embedded inside the through holes 34 can be prevented reliably.

According to the method of forming the bit line relating to the embodiment, since the spacing between the adjoining bit lines BL, BL becomes larger than the width of the bit lines BL, the parasitic capacitance induced between the adjoining bit lines BL, BL can be reduced.

Figure 26:
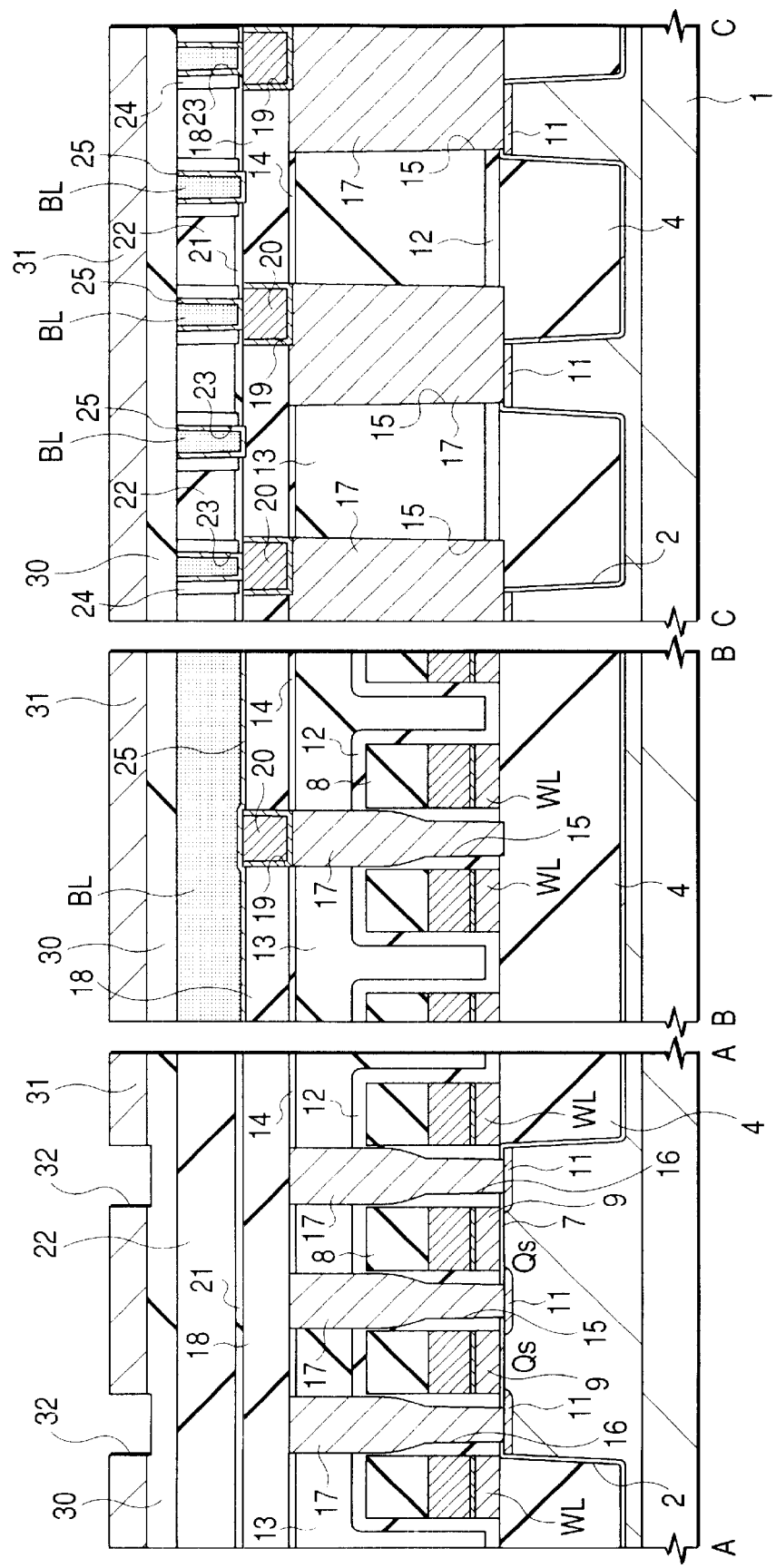
FIG. 26 is a sectional view of a principal part of the semiconductor substrate, illustrating the process of producing the DRAM being one embodiment of the invention.

Next, the process of producing the memory cells after forming the bit lines will be explained in brief. First, as shown in FIG. 26, there needs depositing a silicon nitride film 30 of about 200 nm thick and a polycrystal silicon film 31 of about 300 nm to 400 nm thick, sequentially over the bit line BL by the CVD method, and thereafter forming holes 32 on the polycrystal silicon film 31 that is located right above the contact holes 16, by the dry etching with a photo-resist film (not illustrated) served as the mask. The diameter of the holes 32 is almost equal to the minimum size that is determined by the resolution limit of the photolithography.

Figure 27:
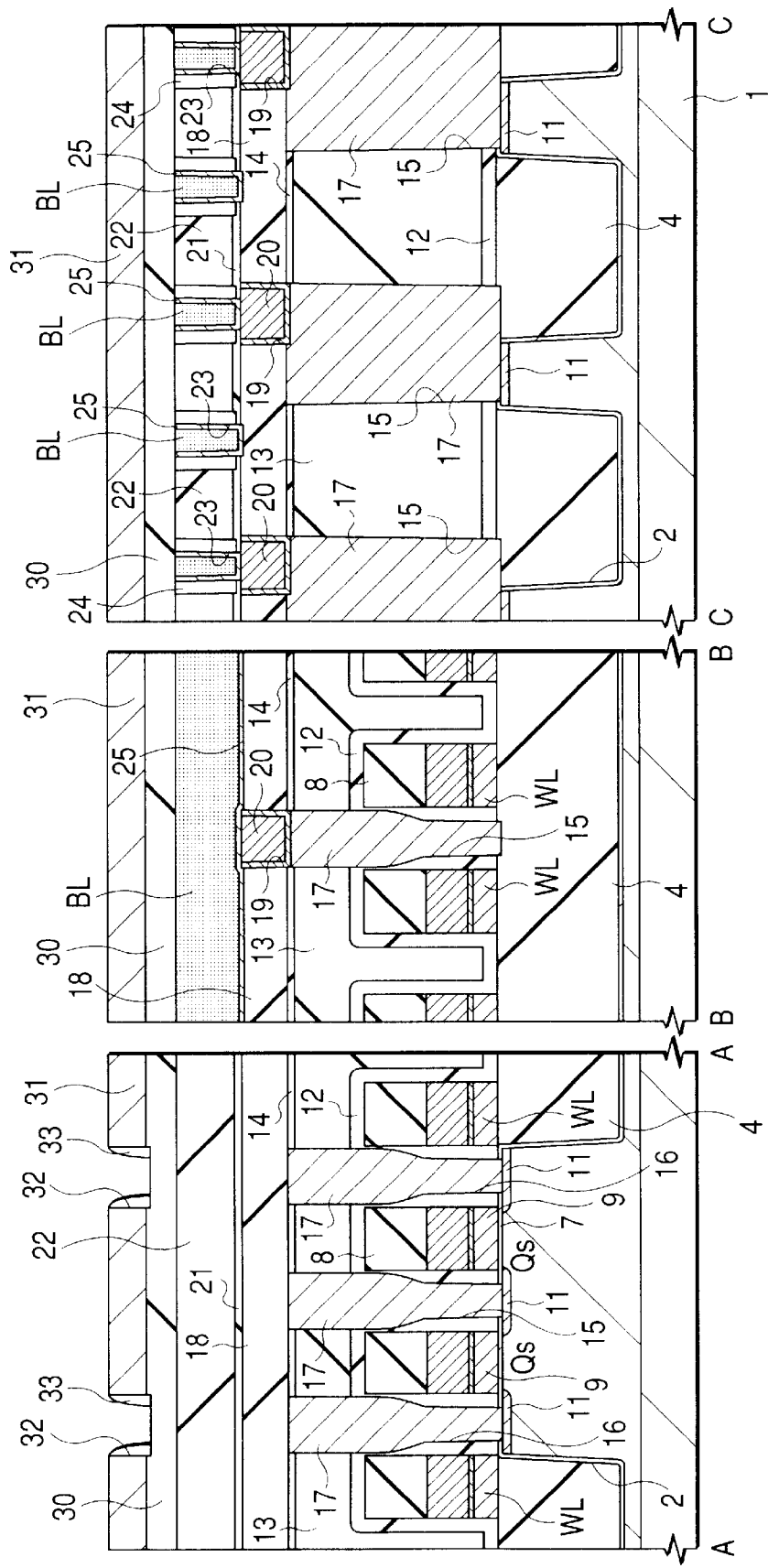
FIG. 27 is a sectional view of a principal part of the semiconductor substrate, illustrating the process of producing the DRAM being one embodiment of the invention.

Next, as shown in FIG. 27, the process forms side wall spacers 33 on the side walls of the holes 32 formed on the polycrystal silicon film 31. The forming of the side wall spacers 33 needs depositing a thin polycrystal silicon film of about 60 nm thick by the CVD method on the polycrystal silicon film 31 including the insides of the holes 32, and thereafter applying the anisotropic dry etching to this polycrystal silicon film to leave it on the side walls of the holes 32. By forming this side wall spacers 33, the substantial diameter of the holes 32 becomes smaller than the minimum size that is determined by the resolution limit of the photolithography.

Figure 28:
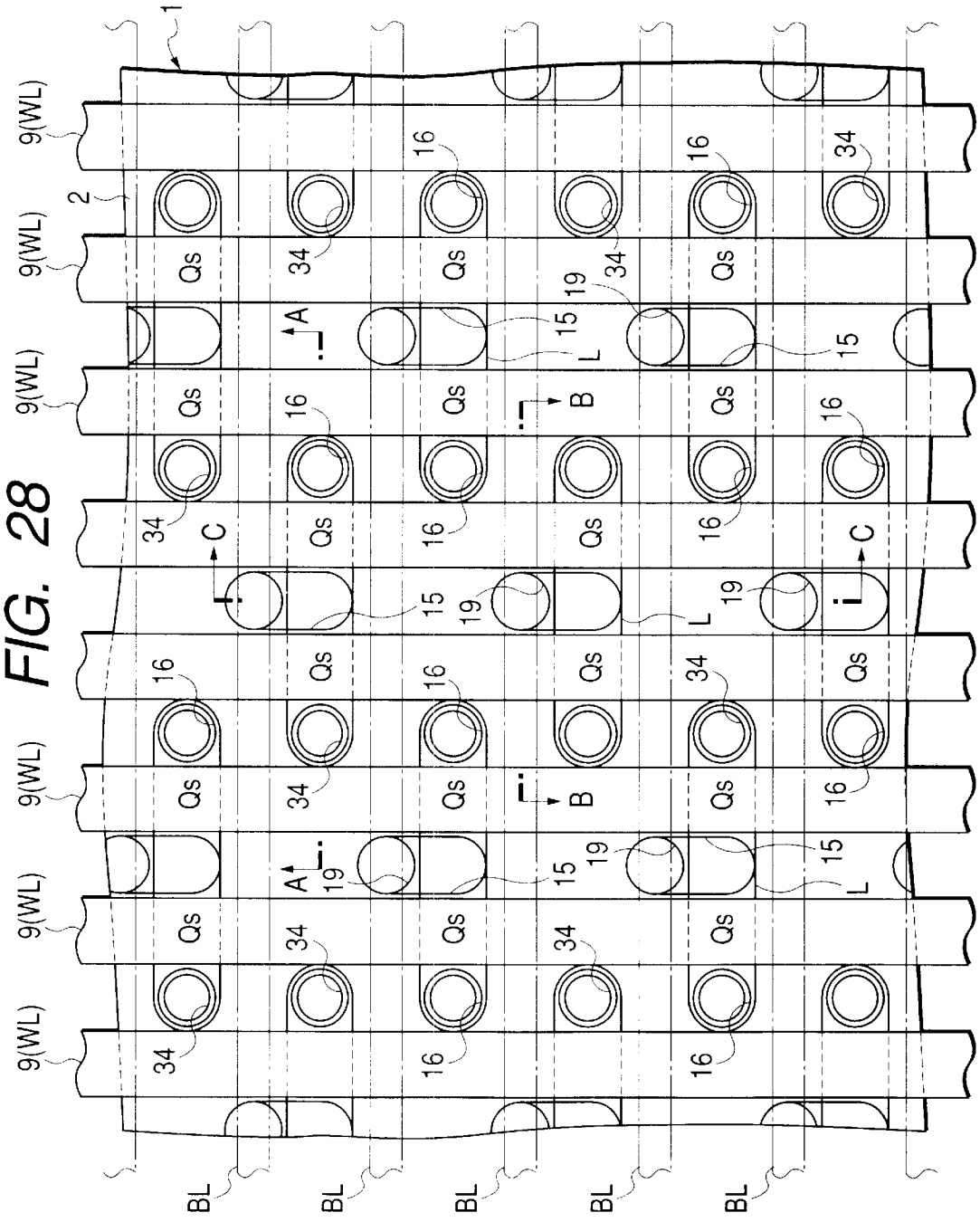
FIG. 28 is a plan view of a principal part of the semiconductor substrate, illustrating the process of producing the DRAM being one embodiment of the invention.
Figure 29:
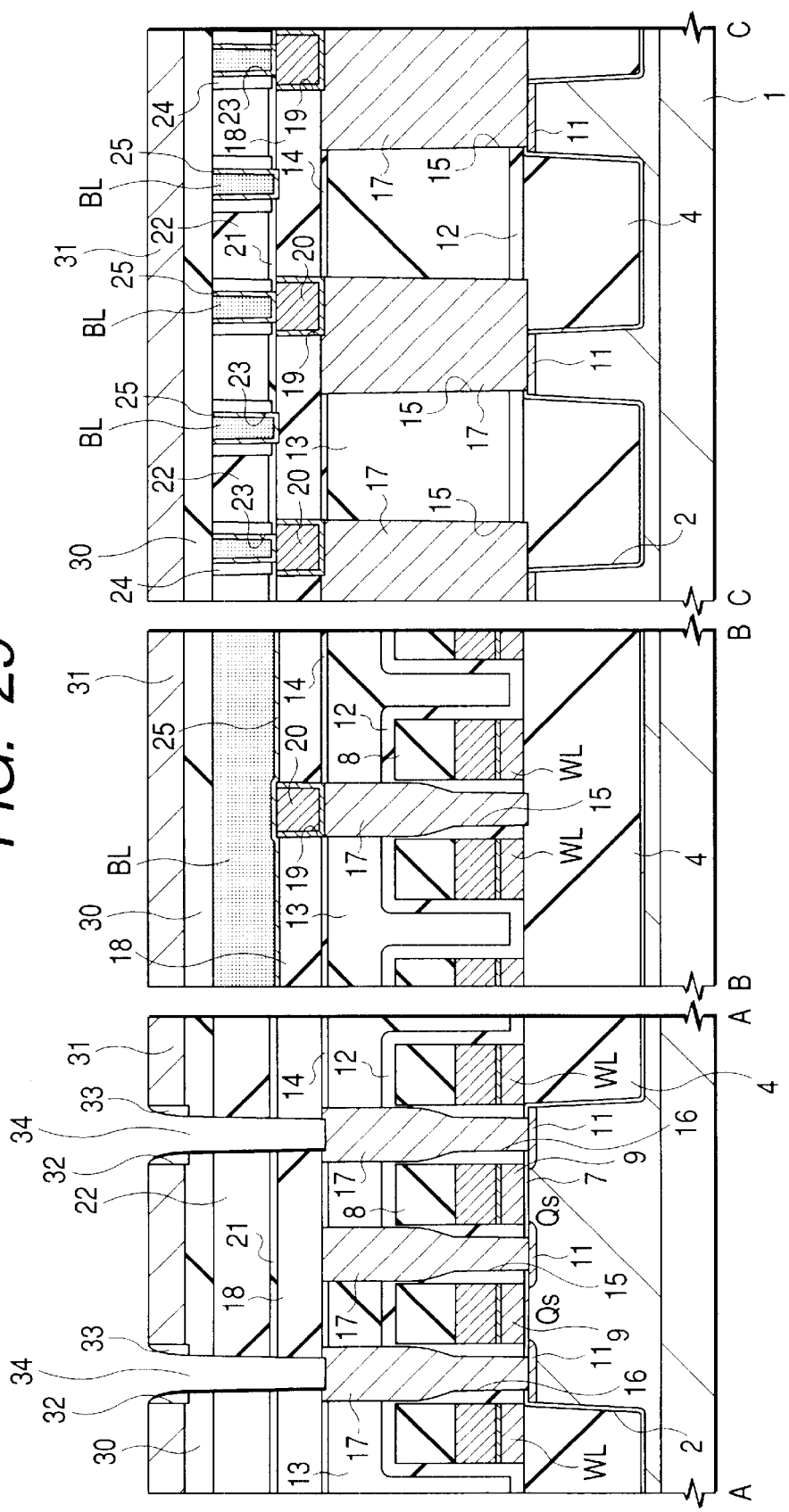
FIG. 29 is a sectional view of a principal part of the semiconductor substrate, illustrating the process of producing the DRAM being one embodiment of the invention.

Next, as shown in FIG. 28 and FIG. 29, the process moves to applying the dry etching sequentially to the silicon nitride film 30 on the bottom of the holes 32, silicon oxide film 22, silicon nitride film 21, and silicon oxide film 18, with the polycrystal silicon film 31 and the side wall spacers 33 served as the mask, to thereby form through holes 34 that reach the contact holes 16, passing the areas between the bit lines BL, BL. The diameter of the through holes 34 is defined by the diameter of the holes 32 with the side wall spacers 33 formed on the side walls thereof, and it is smaller than the minimum size that is determined by the resolution limit of the photolithography. Thus, in cooperation with fining the width of the bit lines BL, the joint margin of the through holes 34 and the bit lines BL can sufficiently be attained. Therefore, even if the memory cell size is shrunk, it is possible to reliably prevent short-circuits between the bit lines BL and plugs 35 being embedded inside the through holes 34 on the subsequent process.

Figure 30:
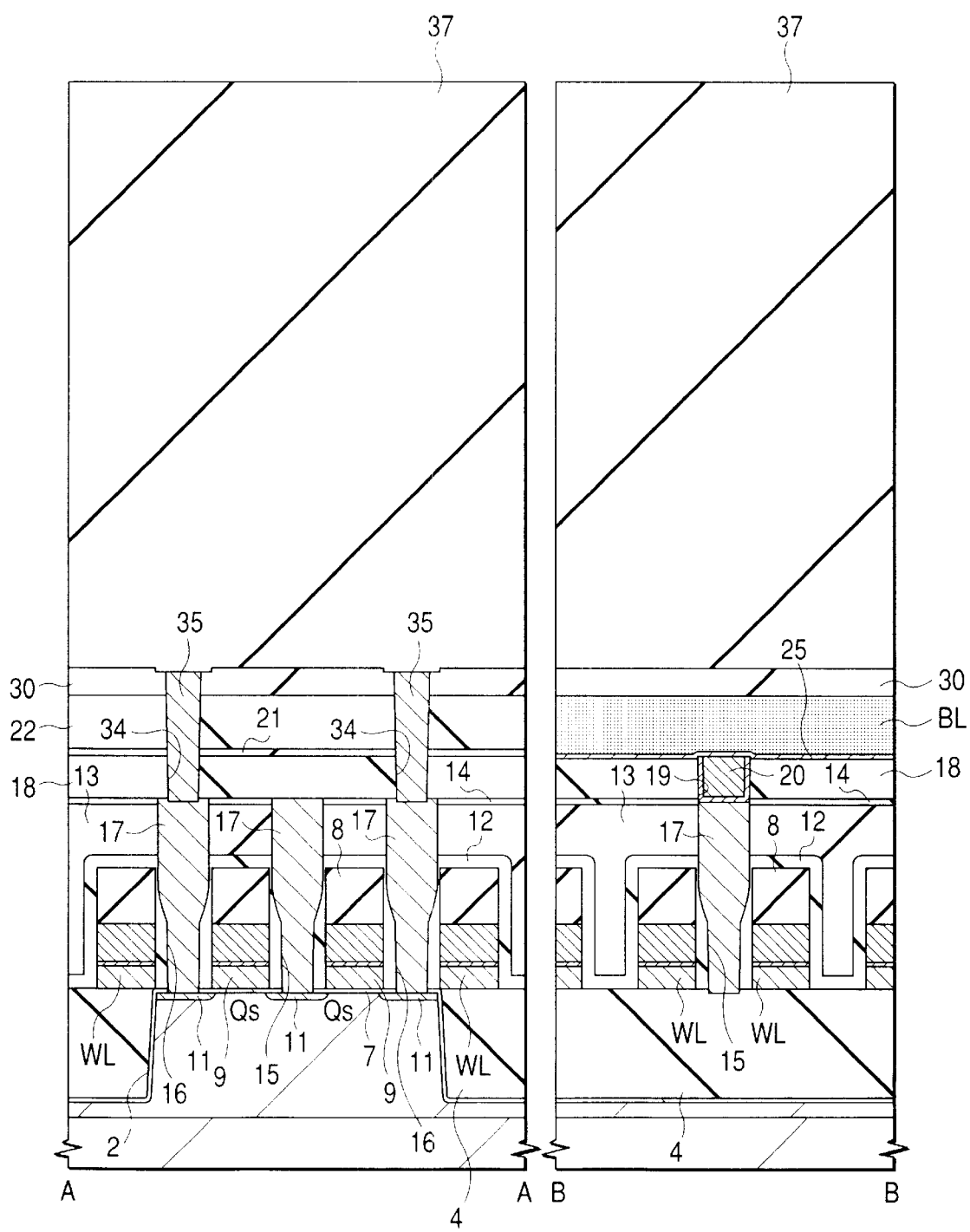
FIG. 30 is a sectional view of a principal part of the semiconductor substrate, illustrating the process of producing the DRAM being one embodiment of the invention.

Next, as shown in FIG. 30, the process, after forming the plugs 35 inside the through holes 34, deposits a thick silicon oxide film 37 of about 2.0 $\mu$m thick over the silicon nitride film 30 by the CVD method. The forming of the plugs 35 needs depositing a low-resistance polycrystal silicon film with n-type impurities such as a phosphor (P) doped, by the CDV method over the silicon nitride film 30 including the insides of the through holes 34, and then polishing the polycrystal silicon film chemically and mechanically to leave it only inside the through holes 34.

Figure 31:
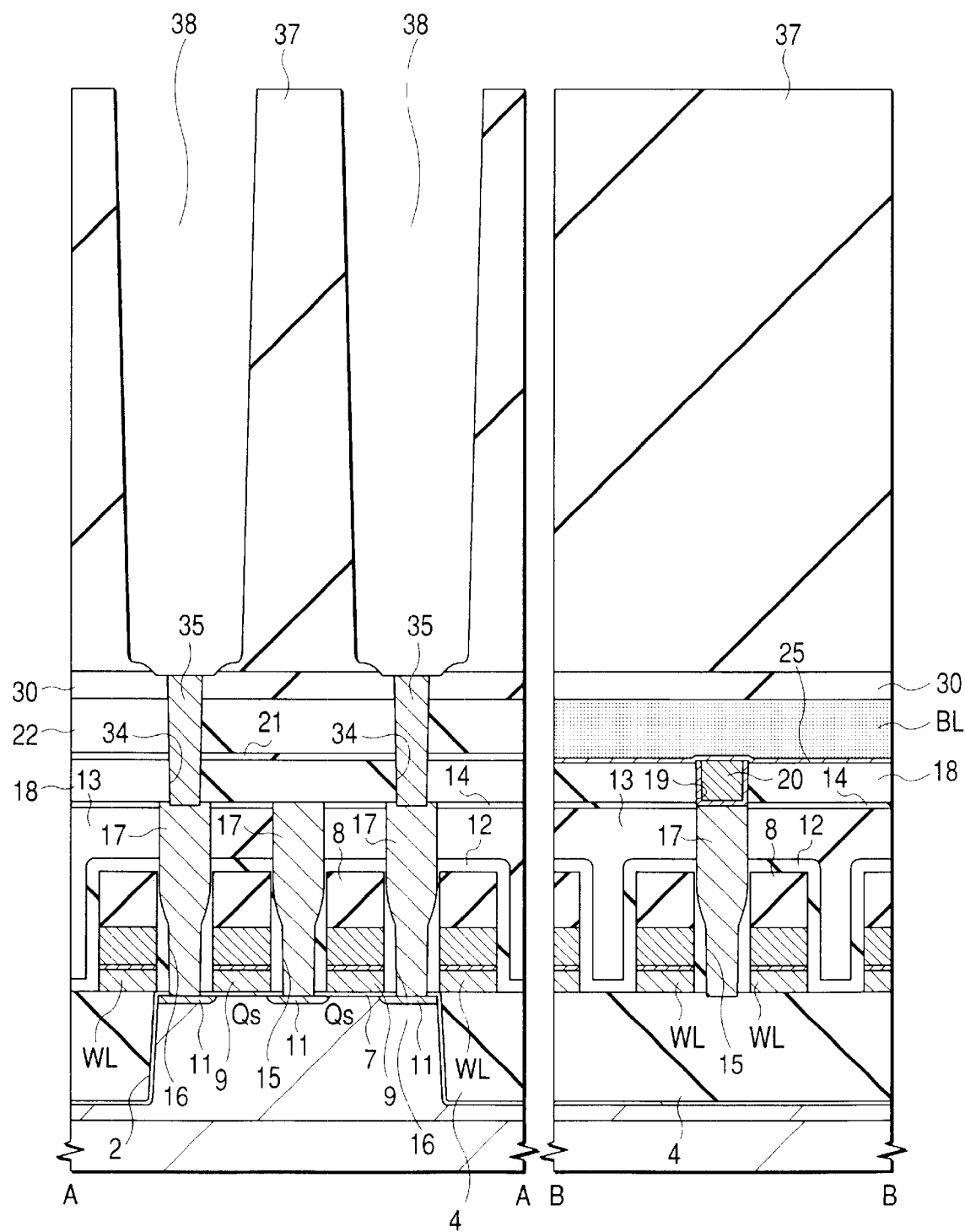
FIG. 31 is a sectional view of a principal part of the semiconductor substrate, illustrating the process of producing the DRAM being one embodiment of the invention.

Next, as shown in FIG. 31, the process applies the dry etching sequentially to the silicon oxide film 37 and the silicon nitride film 30 that underlies it, with a photo-resist film (not illustrated) as the mask, to thereby form grooves 38 above the through holes 34. In forming the deep grooves 38 that reach the through holes 34 from the surface of the silicon oxide film 37, the process needs stopping the etching temporarily on the surface of the silicon nitride film 30, and then etching the silicon nitride film 30 so that the silicon oxide film 22 on the lower layer cannot be washed out.

Figure 32:
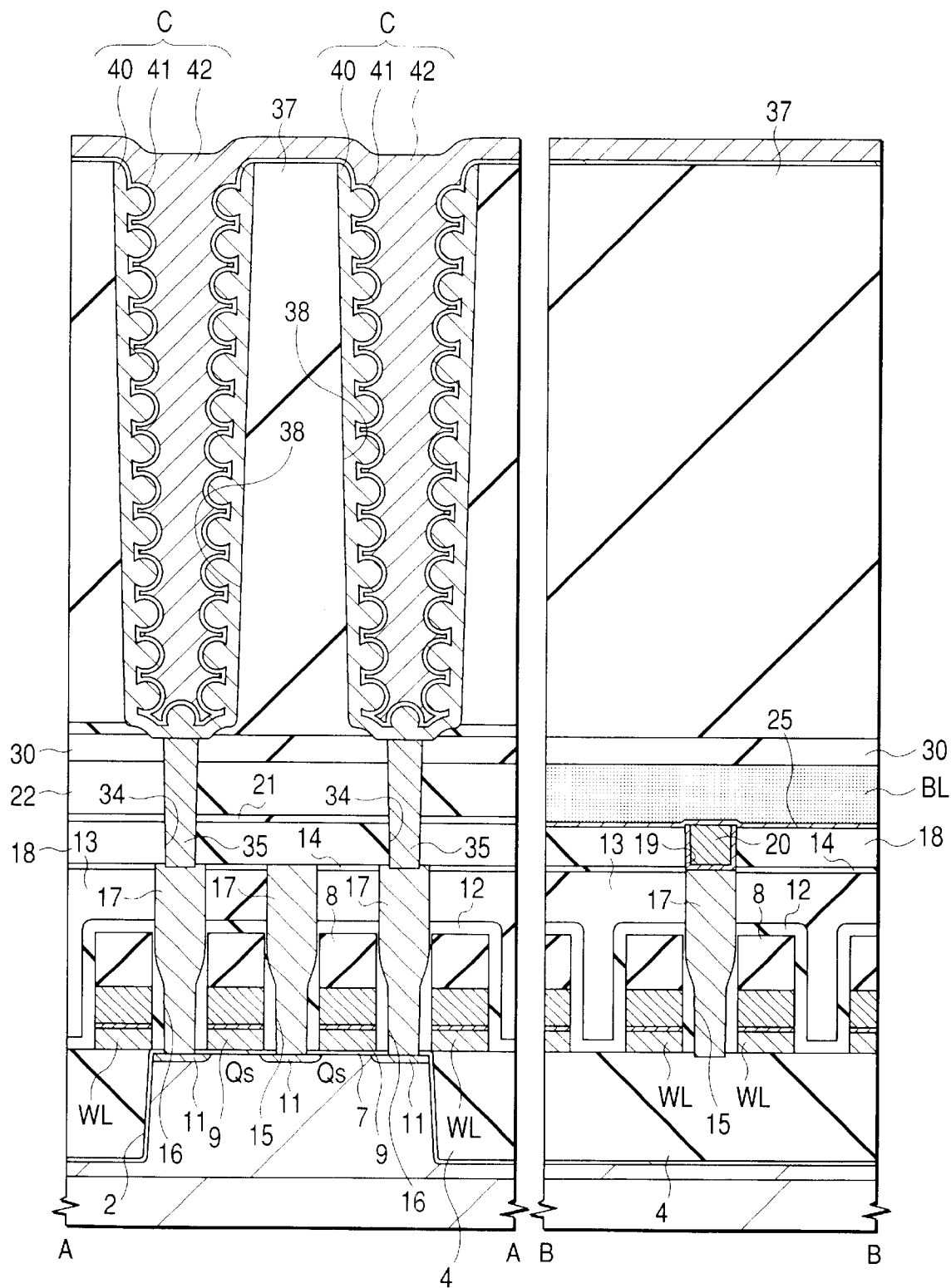
FIG. 32 is a sectional view of a principal part of the semiconductor substrate, illustrating the process of producing the DRAM being one embodiment of the invention.

Next, as shown in FIG. 32, the process forms inside the grooves 38 the data storing capacitors C composed of a lower electrode 40, a capacitance insulating film 41, and an upper electrode 42. The forming of the data storing capacitors C needs depositing a low-resistance polycrystal silicon film of about 50 nm thick, having n-type impurities such as a phosphorous (P) doped, on the silicon oxide film 37 including the insides of the grooves 38 by the CVD method, thereafter embedding a photo-resist film inside the grooves 38, and then etching back the polycrystal silicon film over the silicon oxide film 37 to thereby leave it only on the inner walls of the grooves 38. Thus, the lower electrodes 40 are formed over the inner walls of the grooves 38. Next, there needs depositing a thin tantalum oxide film ($Ta_2O_5$) of about 20 nm thick over the silicon oxide film 37 including the upper parts of the lower electrodes 40 by the CVD method, subsequently depositing a TiN film having such a film thickness that buries the insides of the grooves 38 over the tantalum oxide film ($Ta_2O_5$) by the CVD method and the spattering method, and thereafter patterning the Tin film and the $Ta_2O_5$ film by the dry etching with a photo-resist film (not illustrated) as the mask. The processes to this stage complete to form the memory cells configured with the memory cell selecting MISFETs Qs and the data storing capacitors C connected in series thereto.

After these processes, about two layer aluminum wirings are formed on the data storing capacitors C, further a surface protective membrane is formed on the aluminum wirings, which are omitted in the drawings.

The invention has been described concretely based on the embodiment, however naturally the invention is not limited to the aforementioned embodiment, and it should be understood that various changes and modifications are possible without departing the spirit and scope of the invention.

The method of forming the bit lines relating to the invention can be applied not only to a DRAM, but to a logic LSI mixed integrally with a DRAM, a micro computer incorporating a DRAM and a flash memory, or the like. It can also be applied not only to the bit lines, but widely to a case such that wirings are formed by embedding a conductive film with W as the principal component inside fine wiring grooves formed on a silicon oxide system insulating film.

There are many excellent effects attained by the invention, and the typical ones will be as follows.

According to the invention, since the width of the bit lines can be fined to less than the minimum dimension that is determined by the resolution limit of the photolithography, the memory size of a DRAM is reduced.

According to the invention, since fined bit lines hardly create disconnections, the reliability of a DRAM with the memory size shrunk and the yield on production thereof are enhanced.

According to the invention, since the parasitic capacitance of the bit lines is decreased, the detection sensitivity of a signal stored in the data storing capacitors is improved.

What is claimed is:

1. A method of producing a semiconductor integrated circuit device comprising the steps of:

(a) forming a first insulating film having first grooves over a principal surface of a semiconductor substrate;

(b) forming conductive plugs containing tungsten as a principal component in said first grooves of said first insulating film;

(c) forming a second insulating film having second grooves on said first insulating film;

(d) depositing a third insulating film having a film thickness that does not completely bury inside surfaces of said second grooves, on said second insulating film including said inside surfaces of said second grooves;

(e) forming sidewall spacers comprised of said third insulating film on said second grooves by applying an anisotropic etching to said third insulating film;

(f) depositing a first conductive film in said second grooves on said sidewall spacers and on said conductive plugs;

(g) depositing a second conductive film containing tungsten as a principal component on said first conductive film;

(h) forming first wirings comprised of said first conductive film and said second conductive film on said inside surfaces of said second grooves, by polishing said second and first conductive films chemically and mechanically to remove said first and second conductive films that lie outside said second grooves.

2. A method of producing a semiconductor integrated circuit device according to claim 1, wherein said first conductive film is comprised of TiN.

3. A method of producing a semiconductor integrated circuit device according to claim 1, wherein said first conductive film is one selected from the group comprising TaN, WN and ZrN.

4. A method of producing a semiconductor integrated circuit device according to claim 1, wherein said first insulating film and said second insulating film comprises a silicon oxide as a principal component.

5. A method of producing a semiconductor integrated circuit device according to claim 1, wherein said First conductive film has a higher adhesive strength to said third insulating film than said second conductive film.

6. A method of producing a semiconductor integrated circuit device according to claim 1, wherein at least one joint margin between the first wirings and the plugs is provided to be equal to or narrower than a minimum size determined by the resolution limit of photolithography.

7. A method of producing a semiconductor integrated circuit device according to claim 1, wherein at least one of the first wirings is 1 $\mu$m wide or narrower.

8. A method of producing a semiconductor integrated circuit device according to claim 1, wherein at least one of the first wirings is 0.2 $\mu$m wide or narrower.

9. A method of producing a semiconductor integrated circuit device according to claim 1, wherein at least one of the first wirings is a bit line of a DRAM.

10. A method of producing a semiconductor integrated circuit device according to claim 9, wherein the DRAM includes at least one MISFET with a data storing capacitor overlying the bit line.

* * * * *